(12) United States Patent
Yamazaki

(10) Patent No.: US 7,829,433 B2
(45) Date of Patent: Nov. 9, 2010

(54) SOI SUBSTRATE AND MANUFACTURING METHOD OF THE SAME, AND SEMICONDUCTOR DEVICE

(75) Inventor: Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 210 days.

(21) Appl. No.: 12/076,995

(22) Filed: Mar. 26, 2008

(65) Prior Publication Data

US 2008/0268263 A1 Oct. 30, 2008

(30) Foreign Application Priority Data

Apr. 27, 2007 (JP) .............................. 2007-120288

(51) Int. Cl.
 *H01L 21/30* (2006.01)
 *H01L 21/46* (2006.01)
(52) U.S. Cl. .................. 438/458; 438/474; 257/347; 257/59; 257/72; 257/E21.568; 257/E21.57; 257/E27.111
(58) Field of Classification Search ............... 438/458, 438/474; 257/347, 59, 72, E21.568, E21.57, 257/E27.111, 16, 822
See application file for complete search history.

(56) References Cited

U.S. PATENT DOCUMENTS

| 5,656,516 | A | * | 8/1997 | Suzuki ..................... 438/773 |
| 6,191,007 | B1 | | 2/2001 | Matsui et al. |
| 6,251,754 | B1 | | 6/2001 | Ohshima et al. |
| 6,372,609 | B1 | | 4/2002 | Aga et al. |
| 6,534,380 | B1 | | 3/2003 | Yamauchi et al. |
| 6,849,872 | B1 | | 2/2005 | Yamazaki et al. |
| 2001/0019877 | A1 | | 9/2001 | Miyake et al. |
| 2002/0070454 | A1 | | 6/2002 | Yasukawa |
| 2004/0061176 | A1 | | 4/2004 | Takafuji et al. |

FOREIGN PATENT DOCUMENTS

| JP | 02-054532 | 2/1990 |
| JP | 11-163363 | 6/1999 |

OTHER PUBLICATIONS

International Search Report (Application No. PCT/JP2008/056001) Dated Jul. 1, 2008.
Written Opinion (Application No. PCT/JP2008/056001) Dated Jul. 1, 2008.

* cited by examiner

*Primary Examiner*—Tu-Tu V Ho
(74) *Attorney, Agent, or Firm*—Eric J. Robinson; Robinson Intellectual Property Law Office, P.C.

(57) ABSTRACT

A manufacturing method of a semiconductor substrate is provided, in which a bonding strength can be increased even when a substrate having low heat resistant temperature, e.g., a glass substrate, is used. Heat treatment is conducted at a temperature higher than or equal to a strain point of a support substrate in an oxidation atmosphere containing halogen, so that a surface of a semiconductor substrate is covered with an insulating film. A separation layer is formed in the semiconductor substrate. A blocking layer is provided. Then, heat treatment is conducted in a state in which the semiconductor substrate and the support substrate are superposed with the silicon oxide film therebetween, at a temperature lower than or equal to the support substrate, so that a part of the semiconductor substrate is separated at the separation layer. In this manner, a single crystal semiconductor layer is formed on the support substrate.

30 Claims, 29 Drawing Sheets

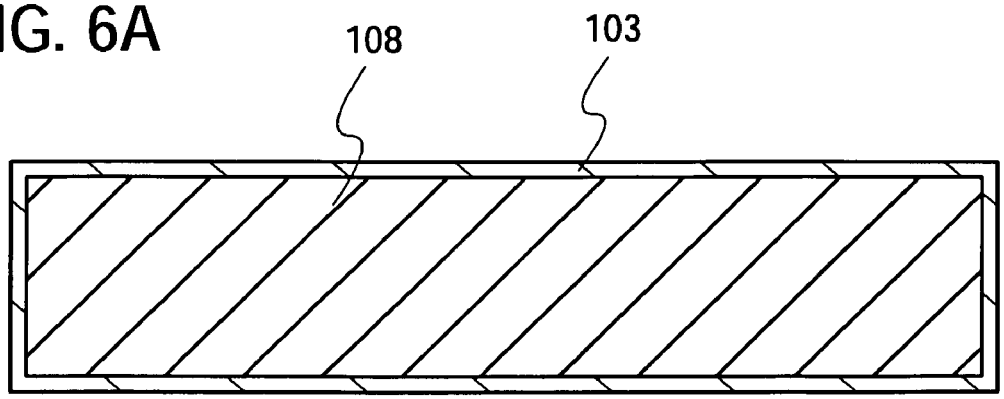
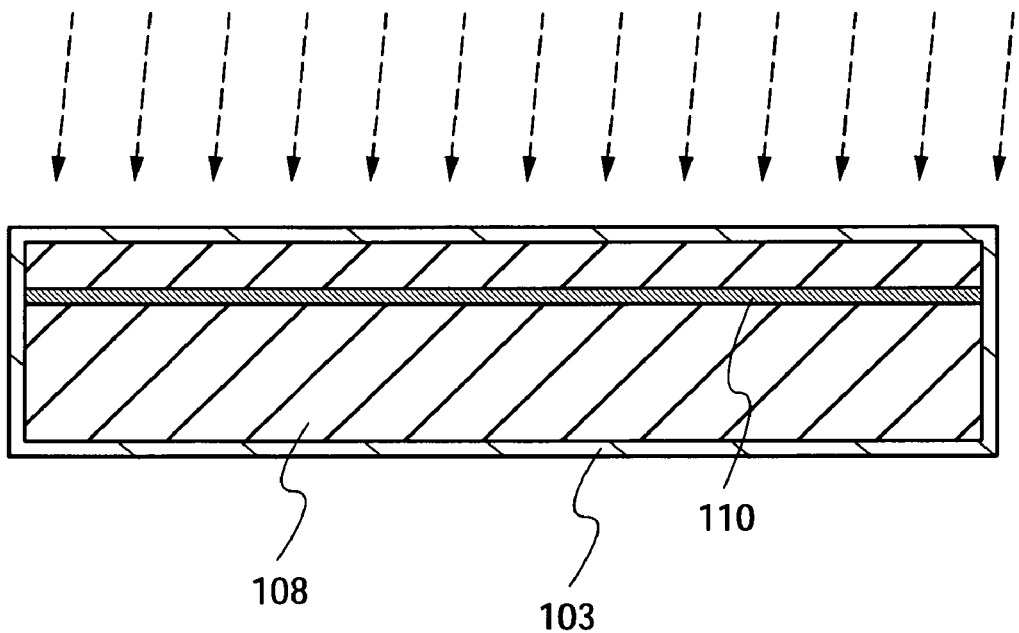

FIG.29

| Acceleration voltage | The ratio of the amount of H (X:Y) | The ratio of the number of H⁺ ions (X:Y/3) |
|---|---|---|
| 80 keV | 1:44.1 | 1:14.7 |
| 60 keV | 1:42.5 | 1:14.2 |
| 40 keV | 1:43.5 | 1:14.5 |

SOI SUBSTRATE AND MANUFACTURING METHOD OF THE SAME, AND SEMICONDUCTOR DEVICE

TECHNICAL FIELD

The present invention relates to a substrate having a silicon-on-insulator (SOI) structure in which a crystalline semiconductor layer formed by thinning a crystalline semiconductor substrate is bonded to a different type of substrate. In particular, the present invention relates to an SOI technique using bonding, and a manufacturing method of an SOI substrate in which a single crystal semiconductor layer is bonded to a substrate having an insulating surface, such as glass. Furthermore, the present invention relates to display devices and semiconductor devices formed using a substrate having such an SOI structure.

BACKGROUND ART

Semiconductor substrates called silicon-on-insulator (SOI substrate) have been developed instead of silicon wafers manufactured by thinly slicing ingots of single crystal semiconductors, and the semiconductor substrates each have a thin single crystal semiconductor layer over a substrate having an insulating surface. By using an SOI substrate, parasitic capacitance of a transistor can be reduced. If an integrated circuit is formed using such a transistor, it is said that it is effective for speeding up of operation and reduction of consumed electric power. Thus, application of SOI substrate to high-performance semiconductor devices such as a microprocessor has been expected.

As a method for manufacturing SOI substrates, a hydrogen ion implantation separation method is known (for example, see Reference 1: U.S. Pat. No. 6,372,609). The hydrogen ion implantation separation method is a method in which hydrogen ions are implanted into a silicon wafer to form a microbubble layer at a predetermined depth from the surface, the surface into which hydrogen ions are implanted is superposed on another silicon wafer, heat treatment is performed to cause separation using the microbubble layer as a cleavage plane, and a thin silicon layer (SOI layer) is bonded to the other silicon wafer. In this method, in addition to the heat treatment for separation of an SOI layer, which is a surface layer, it is necessary to perform heat treatment in an oxidation atmosphere to form an oxide film on the SOI layer, remove the oxide film, perform heat treatment at 1000° C. to 1300° C. in a reducing atmosphere to increase bonding strength, and recover a damaged layer on the surface of the SOI layer.

On the other hand, a semiconductor device in which a single crystal silicon layer is provided for an insulating substrate using a high heat-resistance glass is disclosed (Reference 2: Japanese Patent Published Application No. H11-163363). The semiconductor device has a structure in which the entire surface of a substrate made of a crystalline glass having a strain point of 750° C. or higher is protected with an insulating silicon film, and a single crystal silicon layer obtained by a hydrogen ion implantation separation method is bonded to the insulating silicon film.

DISCLOSURE OF INVENTION

It is necessary to conduct heat treatment at a high temperature of 600° C. or higher to obtain a single crystal silicon layer by separation of a single crystal silicon layer as a surface layer of a silicon wafer by a hydrogen ion implantation separation method. However, when a glass substrate, which is often used for a liquid crystal panel or the like, is used as a support substrate for the sake of cost reduction and a single crystal silicon layer is bonded to the glass substrate, and thus an SOI substrate is formed, there is a problem in that warp of a glass substrate occurs when heat treatment is conducted at high temperature. If a glass substrate warps, the bonding strength between the glass substrate and the single crystal silicon layer is weakened. Further, in bonding the single crystal silicon layer to the glass substrate, impurities such as metal diffused from the glass substrate may contaminate the single crystal silicon layer. In other words, in a conventional technique, if a single crystal silicon layer is formed on a glass substrate and a transistor is formed using the single crystal silicon layer, sufficient characteristics of the transistor cannot be obtained.

The present invention has been made in view of the above problem. It is an object of the present invention to provide an SOI substrate including a crystalline semiconductor layer which is suitable for practical use, even if a substrate having low heat resistance temperature, such as a glass substrate, is used. Further, it is another object of the present invention to provide a semiconductor device using such an SOI substrate.

A single crystal semiconductor layer is bonded to the support substrate at a temperature less than or equal to a strain point of the support substrate having an insulating surface. As to a semiconductor substrate which is a base of this single crystal semiconductor layer, a surface thereof is coated with an insulating film by heat treatment at a high temperature which is greater than or equal to the strain point of the support substrate. A separation layer is formed in the semiconductor substrate. On the other hand, as to the support substrate, a blocking layer that prevents diffusion of impurities contained in the support substrate is formed at a temperature less than or equal to the strain point of the support substrate. After that, the semiconductor substrate, where a separation layer is formed and the support substrate are bonded, heat treatment for cleaving the semiconductor substrate is conducted at a temperature equal to or lower than the strain point of the support substrate, and thus a single crystal semiconductor layer bonded to the support substrate is obtained.

Note that "to implant (including implantation, implanted, implanting, and the like)" of ions means that a semiconductor substrate is irradiated with accelerated ions, in this specification, and that an element constituting ions is contained in the semiconductor substrate. For example, the ion doping is given as such the ion implantation. In addition, a "separation layer" indicates a region in which a crystal structure is disordered and minute voids are produced and which is weakened by an impact of when the semiconductor substrate is irradiated with ions accelerated by electric field and the ions are implanted to the semiconductor substrate. Then, a portion of the single-crystal semiconductor substrate as a semiconductor layer can be left on a support substrate by separating the semiconductor substrate along the separation layer in later heat treatment. Further, in this specification, "to cleave (including cleavage, cleaved, cleaving and the like)" means that a part of the semiconductor substrate is separated along a separation layer in order to form the semiconductor layer on the support substrate. Hereinafter, in this specification, "to cleave" is expressed by "to separate (including separation, separated, separating and the like)".

Heat treatment of a semiconductor substrate for forming an insulating film is preferably conducted in an oxidation atmosphere. In particular, heat treatment is preferably conducted in an oxidation atmosphere containing halogen. For example, heat treatment is conducted in an atmosphere in which a small amount of hydrochloric acid is added to oxygen, to form an oxide film on a semiconductor substrate. By hydrogen contained in the oxide film, dangling bonds at the interface between the semiconductor substrate and the oxide film are terminated so as to inactivate the interface, thereby achieving stability of electric characteristics. Further, chlorine is reacted with metal contained in the semiconductor substrate and function to remove the metal (gettering).

As a blocking layer, a silicon nitride film or a silicon nitride oxide film for preventing diffusion of impurities is provided for a support substrate. Further, a silicon oxynitride film may be combined as an insulating film having a function of reducing stress. Note that a silicon oxynitride film here means a film that contains more content of oxygen than that of nitrogen and, in the case where measurements are performed using Rutherford backscattering spectrometry (RBS) and hydrogen forward scattering (HFS), includes oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, a silicon nitride oxide film means a film that contains more content of nitrogen than that of oxygen and, in the case where measurements are performed using RBS and HFS, includes oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride film or the silicon nitride oxide film is defined as 100 at. %.

Heat treatment at a temperature equal to or higher than a strain point of the support substrate is conducted to the semiconductor substrate to provide an insulating film for the semiconductor substrate. Further, a blocking layer is provided for the support substrate, at a temperature equal to or lower than a strain point of the support substrate. Then, the semiconductor substrate and the support substrate are bonded to each other with the insulating film and the blocking layer therebetween, so that the single crystal semiconductor layer can be prevented from being contaminated by impurities. In addition, the insulating film is formed by conducting heat treatment to the semiconductor substrate in an oxidation atmosphere containing halogen, so that the interface state density between the single crystal semiconductor layer and the support substrate can be lowered. Thus, a semiconductor device which is suitable for practical use can be provided.

BRIEF DESCRIPTION OF THE DRAWINGS

In the accompanying drawings:

FIGS. 6A and 6B are cross-sectional views of a manufacturing process of a substrate having an SOI structure;

FIG. 29 is a list of ratios of fitting parameters (hydrogen atom ratios and hydrogen ion species ratios).

BEST MODE FOR CARRYING OUT THE INVENTION

Embodiment Mode

Figure 1A:
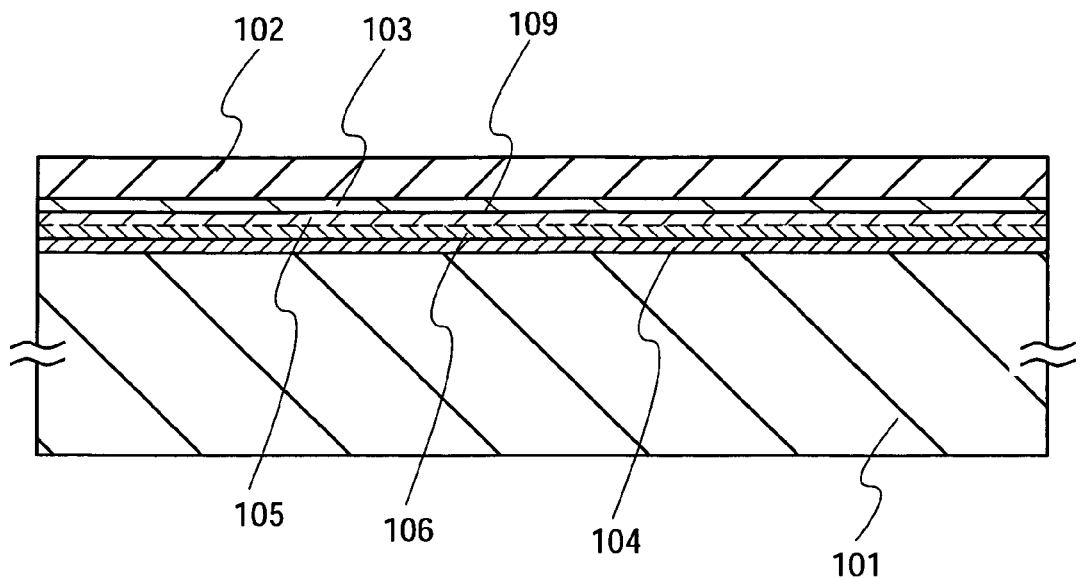
FIGS. 1A and 1B are each a cross-sectional view of a structure of a substrate having an SOI structure.

Embodiment mode of the present invention will be described with reference to the drawings. It is easily understood by those skilled in the art that various changes may be made in modes and details without departing from the spirit and the scope of the invention. Therefore, the present invention should not be interpreted as being limited to the description of the embodiment mode below. In structures of the present invention described below, the same reference numerals are commonly given to the same components or components having similar functions throughout the drawings.

In the description given below, a case where a single crystal semiconductor layer is formed over a substrate having an insulating surface or an insulating substrate is described, however, a polycrystalline semiconductor layer can be bonded to a substrate having an insulating surface or an insulating surface, by selecting a type of semiconductor substrates which are each a base of a semiconductor layer.

Figure 1B:
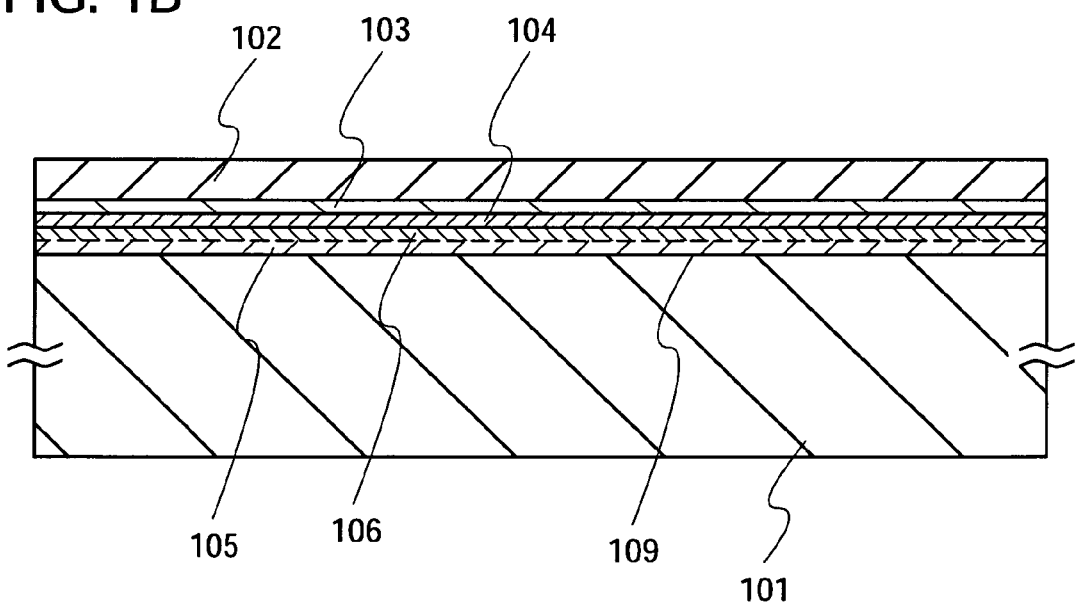

FIGS. 1A and 1B each show a structure of a substrate having an SOI structure according to this embodiment mode. FIG. 1A illustrates a structure in which a single crystal semiconductor layer 102 provided with an oxide film 103 and a blocking layer 109 is bonded to a support substrate 101 with a bonding layer 104 interposed therebetween. In FIG. 1A, the support substrate 101 has an insulating property or an insulating surface, and glass substrates used for electronics industry (also called a "non-alkali glass substrate") such as an aluminosilicate glass substrate, an aluminoborosilicate glass substrate, or a barium borosilicate glass substrate can be used. In other words, a glass substrate having a coefficient of thermal expansion of $25 \times 10^{-7}/°C$. to $50 \times 10^{-7}/°C$. (preferably, $30 \times 10^{-7}/°C$. to $40 \times 10^{-7}/°C$.) and a strain point of 580° C. to 680° C. (preferably, 600° C. to 680° C.) can be used. Alternatively, a quartz substrate, a ceramic substrate, a metal substrate having a surface coated with an insulating film, or the like can be used.

The single crystal semiconductor layer 102 is formed of a crystalline semiconductor substrate. For example, an ion implantation separation method may be employed. By the ion implantation separation method, a single crystal semiconductor substrate is irradiated with hydrogen ions or fluorine ions accelerated by electric field so that such ions are implanted at a predetermined depth from the surface of the single crystal semiconductor substrate, heat treatment is then conducted, and a single crystal semiconductor layer, which is a surface layer, is separated. As the single crystal semiconductor substrate, silicon, germanium or the like can be applied. Further, a substrate made of a compound semiconductor such as silicon germanium, arsenic gallium, or indium phosphide can be used. Alternatively, a method in which single crystalline silicon is epitaxially grown on a porous silicon layer and the porous silicon layer is cleaved by water jetting so as to be separated may also be applied. The thickness of the single crystal semiconductor layer 102 is 5 nm to 500 nm, and preferably 10 nm to 200 nm.

An oxide film 103 is provided on a surface of the single crystal semiconductor layer 102, which is the support substrate 101 side. The oxide film 103 is formed by oxidation of the semiconductor substrate which is a mother body (a base substrate) of the single crystal semiconductor layer 102. The oxide film 103 preferably contains halogen. By containing halogen, defects at the interface between the single crystal semiconductor layer 102 and the oxide film 103 are compensated, so that the local level density can be decreased. Thus, the interface between the single crystal semiconductor layer 102 and the oxide film 103 is inactivated, so that electric characteristics become stable. In addition, halogen is reacted with an impurity such as metal contained in the single crystal semiconductor substrate serving as a base of the single crystal semiconductor layer 102, and the metal reacted with halogen moves into the air, such that the metal can be removed.

Further, the blocking layer 109 is provided in contact with the oxide film 103. As the blocking layer 109, a single layer structure or a stacked structure of a silicon nitride film, a silicon nitride oxide film, and/or a silicon oxynitride film is applied. FIG. 1A illustrates a structure in which a silicon nitride oxide film 105 and a silicon oxynitride film 106 are provided from the oxide film 103 side, as an example of the blocking layer 109. An impurity such as metal contained in the support substrate 101 adversely affects characteristics of a semiconductor element such as a transistor formed using a single crystal semiconductor layer. On the other hand, the silicon nitride oxide film and the silicon nitride film have a function of preventing an impurity from diffusing to the single crystal semiconductor layer 102 side. In addition, the silicon oxynitride film 106 has a function of reducing inner stress of the silicon nitride oxide film 105. By providing the blocking layer 109 having such a stack structure, the single crystal semiconductor layer 102 is prevented from being contaminated by an impurity and stress distortion can be eased.

A bonding layer 104 is provided between the blocking layer 109 and the support substrate 101. The bonding layer 104 has a smooth and hydrophilic surface. As the layer having a surface like this, an insulating layer which is formed by a thermal reaction or a chemical reaction is preferably used. For example, an oxide film which is formed by a thermal reaction or a chemical reaction is suitable. A film formed by chemical reaction is preferable mainly because the smoothness of the surface can be secured. The bonding layer 104 which has a smooth and hydrophilic surface is provided with a thickness of 0.2 nm to 500 nm. With this thickness, it is possible to smooth surface roughness of a surface on which a film is to be formed (a surface which is to form a bond) and also to ensure smoothness of a growing surface of the film. Further, in a case where the blocking layer 109 is provided closer to the single crystal semiconductor layer 102 side than the bonding layer 104 is, the semiconductor substrate that is a base of the single crystal semiconductor layer 102 is bonded to the support substrate 101 at the bonding layer 104, after forming the blocking layer 109, and thus the blocking layer 109 can be formed without considering the heat resistant temperature of the support substrate 101.

As a preferable example of the bonding layer 104, a silicon oxide film which is deposited by a chemical vapor deposition method can be used. In this case, a silicon oxide film formed using an organic silane gas by a chemical vapor deposition method is preferably used. As the organic silane gas, a silicon-containing compound such as tetraethoxysilane (TEOS: chemical formula, $Si(OC_2H_5)_4$), tetramethylsilane (chemical formula, $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), or trisdimethylaminosilane ($SiH(N(CH_3)_2)_3$) can be used. In this case, the bonding layer 104 may be formed on one or both of the support substrate 101 side and the single crystal semiconductor substrate layer 102 side.

The bonding layer 104 is provided between the blocking layer 109 and the support substrate 101, and they are formed in close contact with each other. In this way, bonding can be performed even in a room temperature. When the support substrate 101 and the single crystal semiconductor layer 102 are pressed, the bonding by close contact can be made stronger. The bonding by close contact is formed by attractive force between the surfaces, and thus a more preferred mode can be obtained by adding treatment in which many hydrophilic groups are attached to the surface to form a bond. For example, it is preferable that the surface (the surface on the side in contact with the bonding layer 104) of the support substrate 101 be subjected to oxygen plasma treatment or ozone treatment to have a hydrophilic property. In the case of adding the treatment by which the surface is made to have a hydrophilic property in this manner, hydroxyl groups on the surface act to form a bond due to hydrogen bonding. Further, the surfaces for form a bond are cleaned and the surfaces are formed in contact with each other to form a bond, and the bond is subjected to heat treatment at a room temperature or higher, so that the bond can be strengthened.

As a pretreatment of the surface of the bonding layer 104 and/or a surface to be in contact with the bonding layer 104, it is effective that the surface(s) may be irradiated with an ion beam using an inert gas such as argon so as to be cleaned. By the ion beam irradiation, dangling bonds are exposed on the surface of the bonding layer 104 and/or the surface of the side in contact with the bonding layer 104, and the surface become very active. In this way, when activated surfaces are made in close contact with each other, a bond can be formed even at a low temperature. In the method of forming a bond by activating surfaces, since it is required to keep the surfaces in a highly clean state, the method is preferably carried out in vacuum.

FIG. 1B illustrates a structure in which the blocking layer 109 and the bonding layer 104 are provided on the support substrate 101 side, and the single crystal semiconductor layer 102 provided with an oxide film 103 and the support substrate 101 are bonded. FIG. 1B illustrates a structure in which a silicon nitride oxide film 105 and a silicon oxynitride film 106 are formed from the support substrate 101 side as an example of the blocking layer 109.

Even a glass substrate used in the electronics industry, such as aluminosilicate glass substrates, aluminoborosilicate glass substrates, and barium borosilicate glass substrates (they are called non-alkali glass substrates) contains a small amount of an impurity of an alkali metal such as sodium, or the like. Therefore, if a glass substrate is used for the support substrate 101, the small amount of the impurity diffuses, so that characteristics of a semiconductor element such as a transistor formed using a single crystal semiconductor layer are adversely affected. On the other hand, the silicon nitride oxide film 105 has a function of preventing the impurity such as metal contained in the support substrate 101 from diffusing to the single crystal semiconductor layer 102 side.

Further, in FIG. 1B, since the blocking layer 109 is provided between the bonding layer 104 and the support substrate 101, the single crystal semiconductor layer 102 can be prevented from being contaminated by an impurity diffused from the support substrate 101, and further, the bonding layer 104 can also be prevented from being contaminated. Therefore, decrease of the bonding strength due to the impurity can be prevented.

In addition, the silicon oxynitride film 106 has a function of reducing inner stress of the silicon nitride oxide film 105. The oxide film 103 provided for the single crystal semiconductor layer 102 is formed by oxidizing a semiconductor substrate that is a base of the single crystal semiconductor layer 102 and preferably contains halogen. By containing halogen, defects at the interface between the single crystal semiconductor layer 102 and the oxide film 103 are compensated, so that the local level density of the interface can be decreased. Thus, the interface between the single crystal semiconductor layer 102 and the oxide film 103 is inactivated, so that electric characteristics become stable. In addition, halogen is reacted with an impurity such as metal contained in the single crystal semiconductor substrate serving as a base of the single crystal semiconductor layer 102, and the metal reacted with halogen moves into the air, such that the metal can be removed.

The bonding layer 104 has a smooth and hydrophilic surface is provided between the oxide film 103 and the silicon oxynitride silicon film 106. As a preferable example of the bonding layer 104, a silicon oxide film deposited by a chemical vapor deposition method can be used. The bonding layer 104 is interposed between the oxide film 103 and the silicon oxynitride film 106, and they are in close contact with each other, thereby forming a bond even at a room temperature. Further, by pressing the support substrate 101 and the single crystal semiconductor layer 102, bonding by close contact can be further strengthened. Formation of bonding by the bonding layer 104 is similar to that in FIG. 1A.

By employing the structures of FIGS. 1A and 1B, the single crystal semiconductor layer 102 can be prevented from being contaminated by an impurity. In addition, the local level density at the interface on the bonding layer 104 side of the single crystal semiconductor layer 102 can be decreased. A semiconductor element typified by a transistor can be formed using the single crystal semiconductor layer 102 described above.

Next, a manufacturing method of a substrate having an SOI structure described above is described with reference to FIGS. 2A to 5B.

Figure 2A:
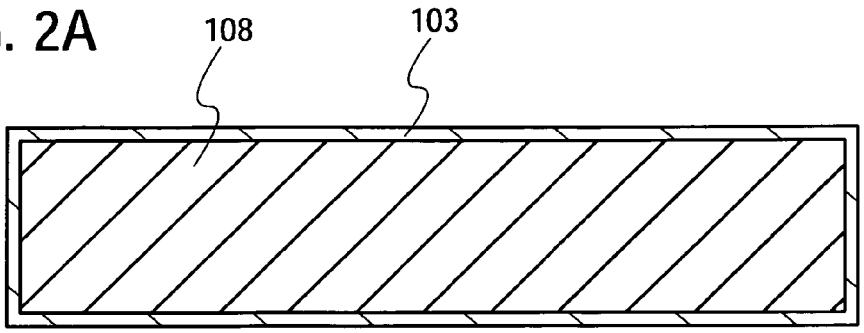
FIGS. 2A to 2C are cross-sectional views of a manufacturing process of a substrate having an SOI structure.

In FIG. 2A, as a semiconductor substrate 108, a p-type or an n-type single crystal silicon substrate (silicon wafer) is typically used. Degreasing washing is performed on the semiconductor substrate 108 and an oxide film on the surface is removed and thermal oxidation is performed. As thermal oxidation, dry oxidation may be performed; however, thermal oxidation in an oxidation atmosphere in which halogen is added is preferably performed. For example, heat treatment is performed at a temperature of 700° C. or higher in an atmosphere containing HCl (hydrogen chloride) as a halogen gas at 0.5 to 10 volume % (preferably 3 volume %) with respect to oxygen. The thermal oxidation may be preferably performed at a temperature of 950 to 1100° C. The processing time may be assumed as 0.1 to 6 hours, preferably 0.5 to 1 hour. The film thickness of the formed oxide film is 10 to 1000 nm, preferably 50 to 200 nm, for example, 100 nm in this embodiment mode.

Besides HCl, one or plural kinds selected from among HF, $NF_3$, HBr, $Cl_2$, $ClF_3$, $BCl_3$, $F_2$, or $Br_2$, or the like can be used as a halogen gas.

Heat treatment is performed within such a temperature range, so that a gettering effect by a halogen element to the semiconductor substrate 108 can be obtained. Gettering has an effect of removing an impurity such as metal, in particular. For example, if HCl is used as a halogen gas, an impurity such as metal contained in the semiconductor substrate 108 turns into a volatile chloride, moves into the air, and is removed by an operation of chlorine. Gettering using halogen is effective when the surface of the semiconductor substrate 108 is subjected to chemical mechanical polishing (CMP). In addition, hydrogen has an operation of compensating defects in an interface between the semiconductor substrate 108 and the oxide film 103 so as to lower a local level density of the interface.

The oxide film 103 is formed by this heat treatment so that halogen can be contained in the oxide film 103. Halogen is contained in the oxide film 103 at a concentration of $1 \times 10^{17}$ atoms/cm$^3$ to $5 \times 10^{20}$ atoms/cm$^3$, so that the oxide film 103 can have a function as a protective film and prevents contamination of the semiconductor substrate 108 due to an impurity such as metal, since halogen captures such an impurity such as metal.

Figure 2B:
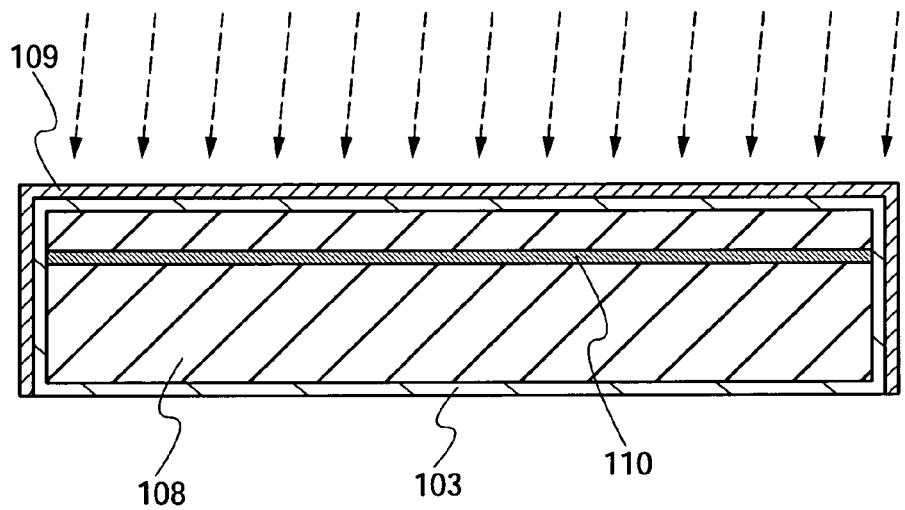

FIG. 2B illustrates a mode in which the blocking layer 109 is formed on the semiconductor substrate 108 provided with the silicon oxide film 103, and the semiconductor substrate 108 is irradiated with hydrogen ions or halogen ions to form a separation layer 110. As the blocking layer 109, a silicon nitride film or a silicon nitride oxide film is formed to a thickness of from 50 nm to 200 nm. For example, the silicon nitride film is formed using $SiH_4$ and $NH_3$ as a source gas by a plasma CVD method. The silicon nitride oxide film is formed using $SiH_4$, $N_2O$ and $NH_3$ as a source gas by a plasma CVD method. The blocking layer 109 exhibits a function of preventing diffusion of impurities into a single crystal semiconductor layer formed from the semiconductor substrate 108. In formation of the separation layer 110, the blocking layer 109 has a function of preventing planarity from being lost due to damages to the surface of the semiconductor substrate 108 by ion irradiation. In the manufacturing method of FIGS. 2A to 5B, after the blocking layer 109 is provided for the semiconductor substrate 108, the semiconductor substrate 108 is bonded to the support substrate 101. Thus, the blocking layer 109 can be formed without considering the heat resistant temperature of the support substrate 101.

The separation layer 110 is formed at a predetermined depth from the surface of the semiconductor substrate 108 by irradiation of the semiconductor substrate 108 with ions accelerated by electric field. The depth of the separation layer 110 formed in the semiconductor substrate 108, from the surface of the semiconductor substrate 108 can be controlled by acceleration energy and irradiation angle of the ions. The separation layer 110 is formed in a region which is close to an average depth of ions which have entered the semiconductor substrate 108 from the surface of the semiconductor substrate 108. For example, the thickness of the single crystal semiconductor layer is from 5 nm to 500 nm, preferably from 10 nm to 200 nm, inclusive, and the accelerating voltage in ion implantation is determined in consideration of the thickness. For example, the thickness of the single crystal semiconductor layer is set in the range of from 5 nm to 500 nm, preferably from 10 nm to 200 nm, and the accelerating voltage in ion implantation is determined in consideration of the thickness. The ion implantation is preferably conducted with an ion doping apparatus. In other words, a doping apparatus for implanting plural ion species which are generated by making a source gas into plasma and which are not subjected to mass separation, is used. In this embodiment mode, it is preferable to irradiate a single type of ions or a plurality of types ions of the same atom that have different masses. At the ion doping, the accelerating voltage may be 10 kV to 100 kV, and preferably 30 kV to 80 kV; the dose amount may be $1\times10^{16}$ ions/cm$^2$ to $4\times10^{16}$ ions/cm$^2$; and the beam current density may be equal to or greater than 2 μA/cm$^2$, preferably equal to or greater than 5 μA/cm$^2$, and more preferably equal to or greater than 10 μA/cm$^2$. Note that the term "ion doping" in this specification means a system in which an object is irradiated with ion generated from a source gas and are accelerated by electric field, without being to subjected to mass separation.

In the case of irradiation with hydrogen ions, it is preferable that $H^+$, $H_2^+$, and $H_3^+$ ions are contained and the rate of $H_3^+$ ions is made higher than those of $H^+$, and $H_2^+$ ions. By making the rate of $H_3^+$ ions higher, implantation efficiency can be increased and the time for ion irradiation can be shortened. Accordingly, the region of the separation layer 110 formed in the semiconductor substrate 108 can contain hydrogen at a concentration equal to or higher than $1\times10^{20}$ atoms/cm$^3$ (preferably, $5\times10^{20}$ atoms/cm$^3$) by the ion irradiation. In this manner, when the semiconductor substrate 108 is irradiated with ions, by making the rate of $H_3^+$ ions higher than those of $H^+$, and $H_2^+$ ions, the separation layer to be used for a later separation step can be formed by using a smaller number of ions than that of the case where the rate of $H_3^+$ ions is not high. When a region in which hydrogen is contained at a high concentration is locally formed in the semiconductor substrate 108, the crystal structure is disordered and minute voids are formed, so that the separation layer 110 having a porous structure can be obtained. In this case, the volume of the minute voids formed in the separation layer 110 is changed by heat treatment at a relatively low temperature, and separation occurs along the separation layer 110; accordingly, a thin single crystal semiconductor layer can be formed.

Even when the ions are mass-separated and implanted to the semiconductor substrate 108, the separation layer 110 can be formed similarly. In this case also, it is preferable that $H_3^+$ ions is selectively implanted to the semiconductor substrate, rather than implanting $H^+$, $H_2^+$ ions, because the effect similar to the above-mentioned can be achieved.

Other than hydrogen, deuterium or an inert gas such as helium can also be selected as the gas from which ion species are generated. When helium is used as a source gas and an ion doping apparatus which does not have a mass-separation function is used, an ion beam with a high rate of $He^+$ ions can be obtained. By irradiating the semiconductor substrate 108 with such ions, minute voids can be formed and the separation layer 110 similar to the above can be provided in the semiconductor substrate 108.

Figure 2C:
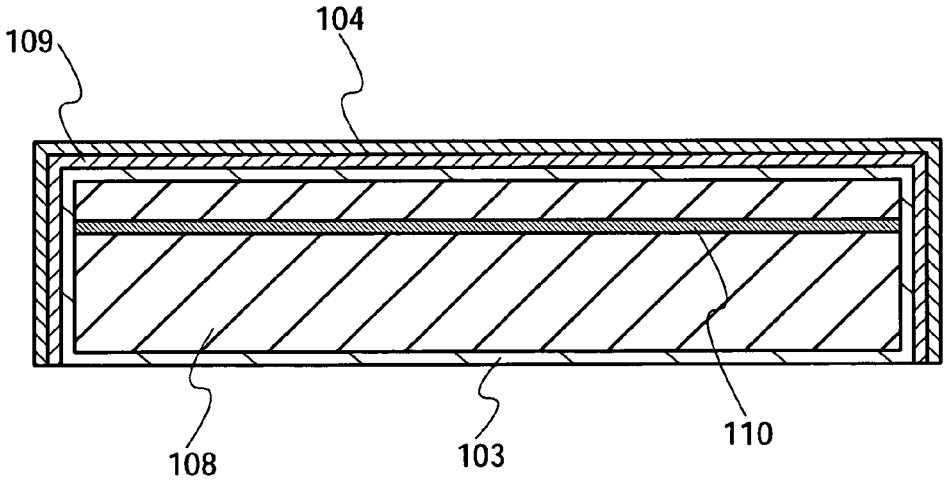

FIG. 2C illustrates a mode in which the bonding layer 104 is formed. A silicon oxide film is preferably formed as the bonding layer 104. The thickness of the silicon oxide film may be set at 10 nm to 200 nm, preferably 10 nm to 100 nm, and more preferably 20 nm to 50 nm. As the silicon oxide film, a silicon oxide film formed by chemical vapor deposition using an organic silane gas is preferable. As the organic silane gas, a silicon-containing compound such as tetraethoxysilane (TEOS: chemical formula, $Si(OC_2H_5)_4$), tetramethylsilane (chemical formula, $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), or trisdimethylaminosilane ($SiH(N(CH_3)_2)_3$) can be used. Further, a silicon oxide film formed by a chemical vapor deposition method using a silane gas can be also applied. In deposition by a chemical vapor deposition method, film formation by a chemical vapor deposition method is performed at a temperature, for example, 350° C. or lower, at which degassing of the separation layer 110 that is formed in the semiconductor substrate does not occur (a temperature at which the surface of the silicon oxide film that is formed as the bonding layer 104 is not roughened or at which a crack is not formed in the separation layer 110). When a single crystal or polycrystalline semiconductor substrate is used as the semiconductor substrate 108, heat treatment for separating a single crystal semiconductor layer or a polycrystalline semiconductor layer from the substrate is performed at a higher temperature than the temperature at which the bonding layer 104 is formed.

In addition, in the steps of FIGS. 2B and 2C, after forming the separation layer 110, the blocking layer 109 and the bonding layer 104 may be formed. In this step, for example, if a multichamber CVD apparatus is used, the blocking layer 109 and the bonding layer 104 can be sequentially formed without being exposed to the air, so that contamination due to foreign matters or potassium or sodium or the like can be prevented.

Figure 3A:
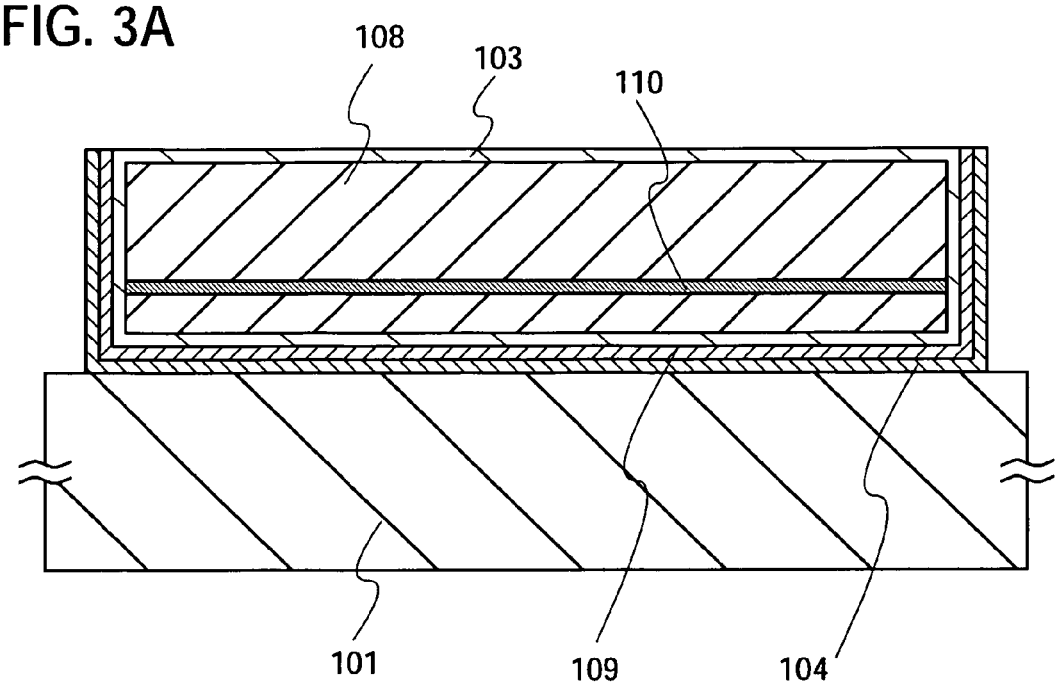
FIGS. 3A and 3B are cross-sectional views of a manufacturing process of a substrate having an SOI structure.

FIG. 3A illustrates a mode in which the support substrate 101 is bonded to the semiconductor substrate 108. The support substrate 101 and a surface of the bonding layer 104 provided on the semiconductor substrate 108, face each other and are in close contact with each other, so that they are bonded. Surfaces which are to form a bond are cleaned sufficiently. By locating the support substrate 101 in close contact with the bonding layer 104, the bond is formed therebetween by Van der Waals forces. By pressing the support substrate 101 and the semiconductor substrate 108 against each other, a stronger bond than the bond by Van der Waals forces can be formed by hydrogen bonding.

In order to form a favorable bond, the surface(s) which is/are to form a bond between the bonding layer 104 and the support substrate 101 may be activated. For example, the surface(s) which is/are to form a bond is/are irradiated with an atomic beam or an ion beam. When an atomic beam or an ion beam is used, an inert gas neutral atom beam or inert gas ion beam of argon or the like can be used. Alternatively, plasma irradiation or radical treatment is performed. Such a surface treatment makes it possible to increase bonding strength between different kinds of materials even if a later heat treatment step is performed at a temperature of 200° C. to 400° C.

Figure 3B:
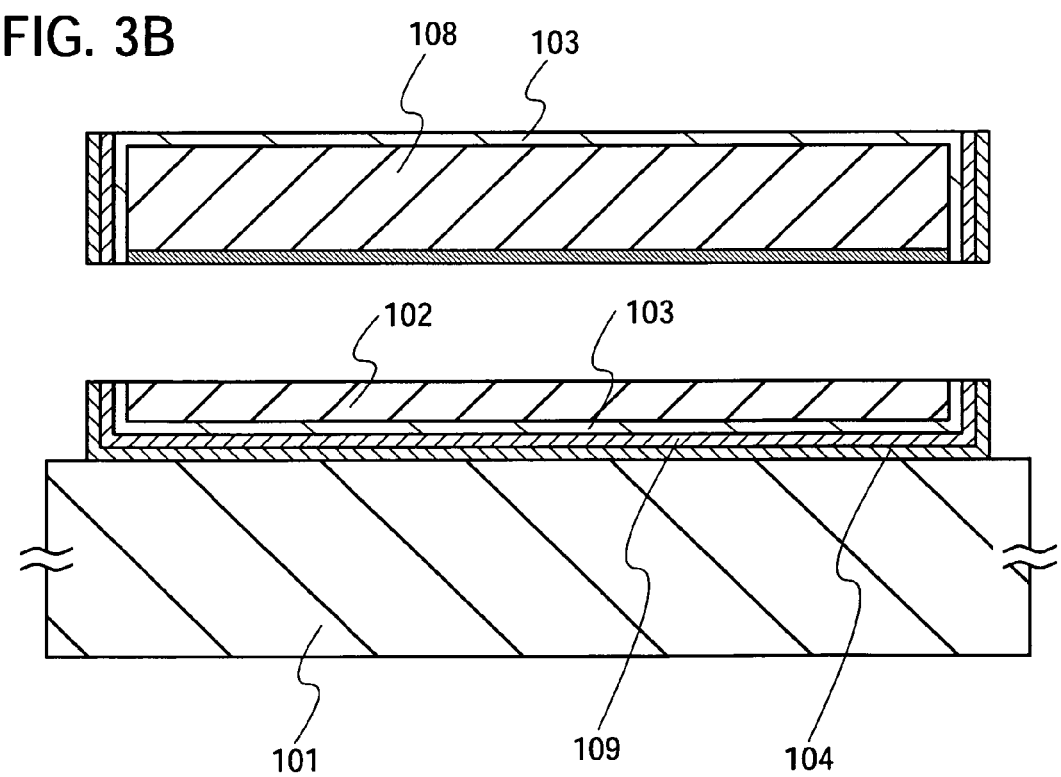

FIG. 3B illustrates a mode in which the single crystal semiconductor layer 102 is separated from the semiconductor substrate 108 by heat treatment. The heat treatment is conducted in a state in which the semiconductor substrate 108 and the support substrate 101 are superposed. By the heat treatment, the semiconductor substrate 108 is separated from the support substrate 101 with the single crystal semiconductor layer 102 left on the support substrate 101. The heat treatment is preferably conducted at a temperature higher than or equal to the formation temperature of the bonding layer 104 and lower than or equal to a heat resistant temperature of the support substrate 101. For example, by conducting the heat treatment at a temperature higher than or equal to 400° C. and lower than 600° C., the volume of minute voids formed in the separation layer 110 is changed, so that separation can be done along the separation layer 110. Since the bonding layer 104 is bonded to the support substrate 101, the single crystal semiconductor layer 102 having the same crystallinity as the semiconductor substrate 108 is bonded and is left on the support substrate 101.

Figure 4A:
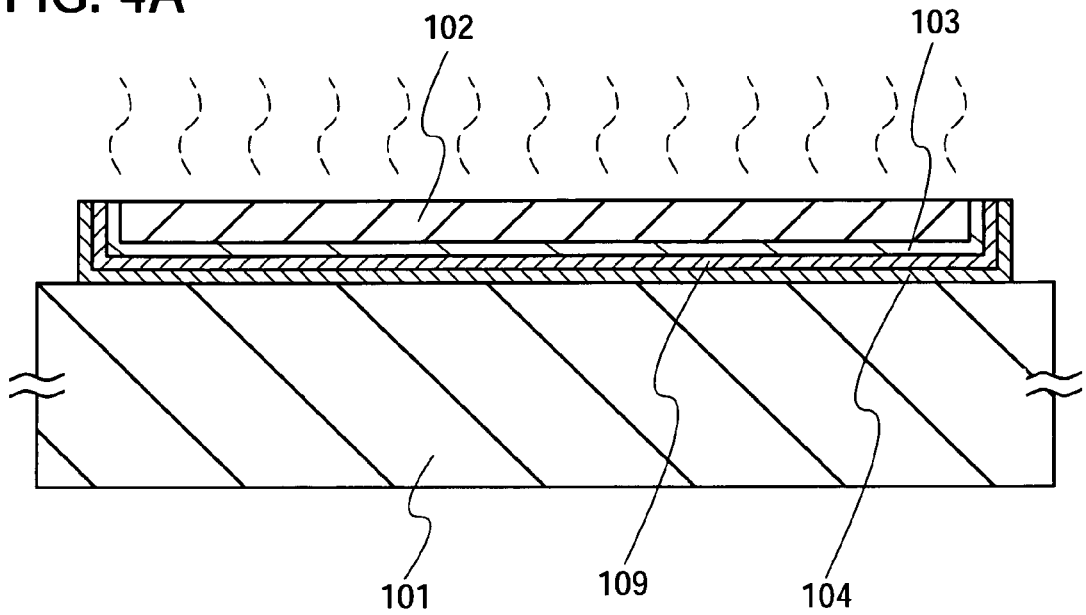
FIGS. 4A and 4B are cross-sectional views of a manufacturing process of a substrate having an SOI structure.

FIG. 4A illustrates a mode in which heat treatment is conducted while the single crystal semiconductor layer 102 is fixed on the support substrate 101. The heat treatment is conducted so that hydrogen ions or halogen ions implanted to form the separation layer 110 are removed from the single crystal semiconductor layer 102. Further, it is preferably conducted so that minute voids in the bonding portion between the support substrate 101 and the single crystal semiconductor layer 102 are removed. The temperature of heat treatment is greater than or equal to a temperature at which hydrogen or halogen is discharged from the single crystal semiconductor layer 102, and a temperature close to a strain point of the support substrate 101 is acceptable. For example, the heat treatment is performed at a temperature range of 400 to 730° C. As a heat treatment apparatus, an electrically-heated oven, a lamp annealing furnace, or the like can be applied. The heat treatment may be performed by changing temperature at multiple steps. Alternatively, a rapid thermal annealing (RTA) apparatus may be used. In the case of performing heat treatment by the RTA apparatus, the heat treatment can be conducted at a temperature close to the strain point of the substrate or a temperature slightly higher than the strain point.

There is a case where excessive hydrogen contained in the single crystal semiconductor layer 102 indicates a complicate behavior and operates to deteriorate characteristics of a semiconductor element depending on thermal history. For example, hydrogen contained between lattices of silicon operates to inactivate an impurity element used in doping for controlling value electrons. Accordingly, a threshold voltage of a transistor varies and thus a source or drain region is made to have high resistance. When hydrogen is contained in lattices of silicon, there is a case that the coordination number of silicon varies and behaves so as to generate lattice defects. Needless to say, hydrogen or halogen has an operation of compensating a dangling bond in silicon, i.e., repairing the defects. However, hydrogen or halogen which is implanted to form the separation layer 110 is preferably once removed from the single crystal semiconductor layer 102.

A hydrogen bonding of a bonding surface of the support substrate 101 and the single crystal semiconductor layer 102 can be changed into a stronger covalent bond by performing such heat treatment.

Figure 4B:
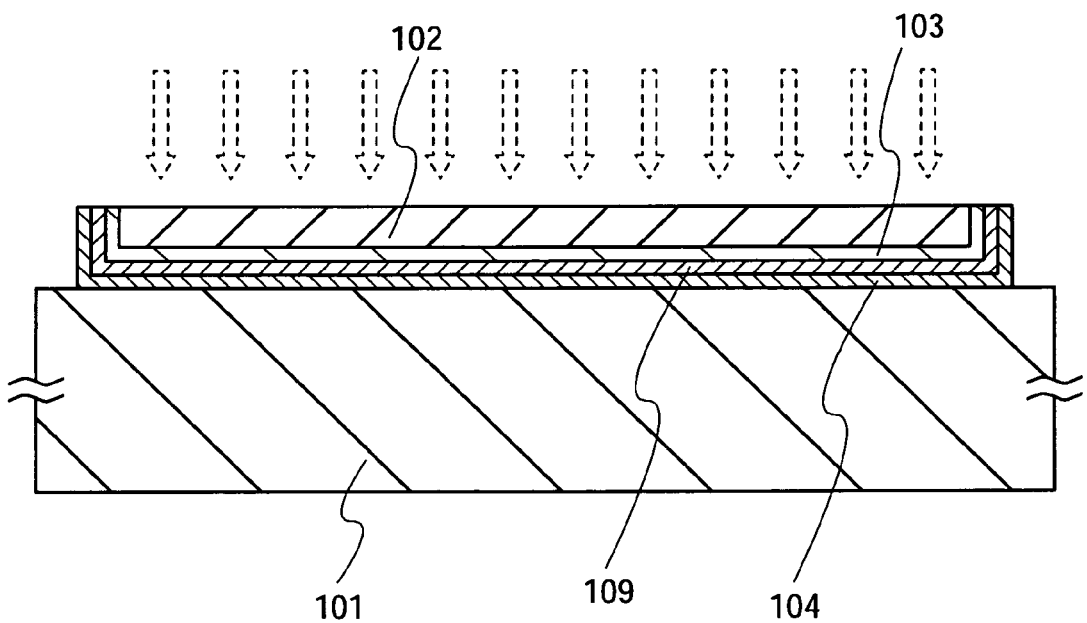

FIG. 4B illustrates a mode in which crystal defects are repaired by irradiation of the single crystal semiconductor layer 102 with energy beam. When the single crystal semiconductor layer 102 is bonded to the support substrate 101, the single crystal semiconductor layer 102 is thermally and/or mechanically damaged so that the crystallinity of the single crystal semiconductor layer 102 is decreased. Thus, irradiation of energy beam is preferably conducted to repair the damages. The energy beam is preferably a beam that is selectively absorbed by the single crystal semiconductor layer 102. A laser beam is preferable. This is because the laser beam can recover the defects of the single crystal semiconductor layer 102, without heating excessively the support substrate 101. As the laser beam, a gas laser typified by an excimer laser or a solid state laser typified by a YAG laser can be used as a light source. A wavelength of the laser beam is preferably in a range of from ultraviolet light to a visible light region, and a wavelength of 190 to 700 nm is applied. The laser beam emitted from the light source is preferably converged in a rectangular or linear shape by an optical system, and irradiation may be performed by scanning the laser beam on the single crystal semiconductor layer 102.

Besides, flash lamp annealing which is performed using a halogen lamp, a xenon lamp, or the like may be applied for a similar object.

In FIG. 4C, the single crystal semiconductor layer 102 is dehydrogenated (hydrogen withdrawal) or dehalogenated (halogen withdrawal) in this step; therefore, crystal defects can be repaired without causing a void in the single crystal semiconductor layer 102. In addition, in FIG. 4B, when treatment of irradiating the single crystal semiconductor layer 102 with an energy beam is performed in a nitrogen atmosphere, the surface of the single crystal semiconductor layer 102 can be planarized.

Figure 5A:
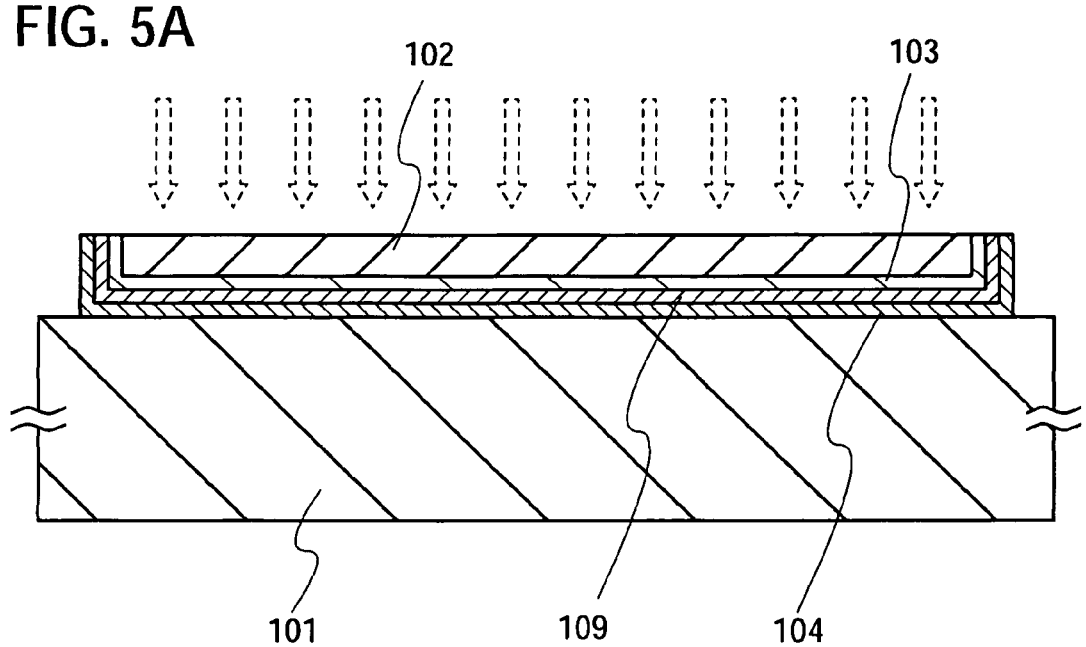
FIGS. 5A and 5B are cross-sectional views of a manufacturing process of a substrate having an SOI structure.
Figure 5B:
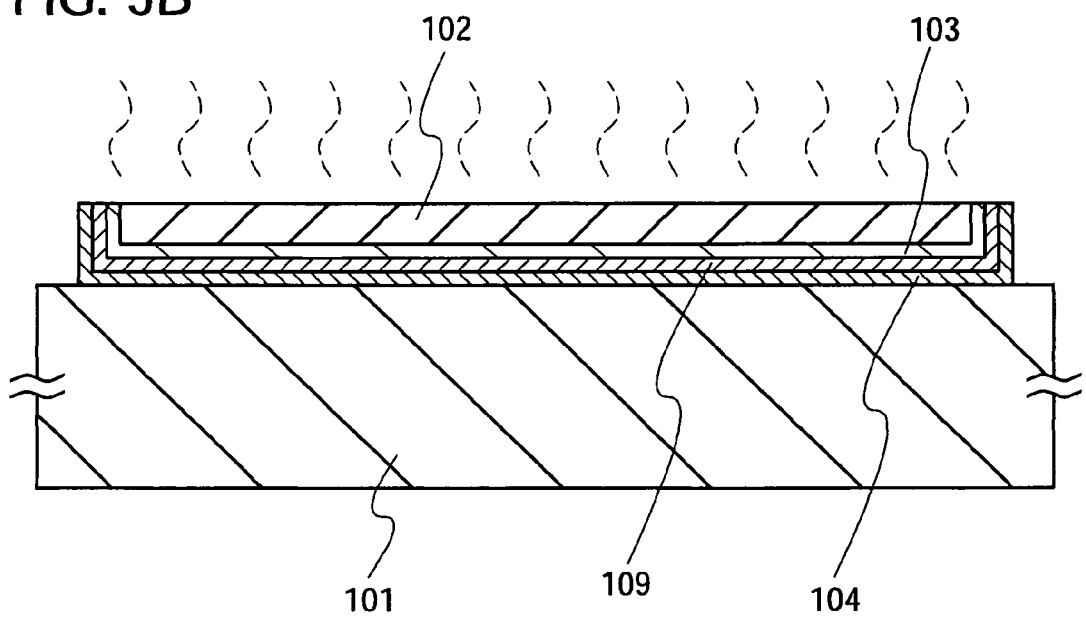

On the other hand, when the content of hydrogen contained in the single crystal semiconductor layer 102 is small, as illustrated in FIG. 5A, the semiconductor substrate may be separated while leaving the single crystal semiconductor layer 102 bonded to the support substrate 101, and then irradiation with energy beam may be conducted to repair crystal defects of the single crystal semiconductor layer 102. After repairing the crystal defects of the single crystal semiconductor layer 102, heat treatment illustrated in FIG. 5B is conducted so that thermal distortion of the single crystal semiconductor layer 102 and the support substrate 101 is eliminated, thereby increasing the bonding strength.

Next, another manufacturing method of a substrate having an SOI structure is described with reference to FIGS. 6A to 8B.

In FIG. 6A, the oxide film 103 is formed on the semiconductor substrate 108 by thermal oxidation. The oxide film 103 is preferably formed by thermal oxidation at a temperature of 700° C. or higher, preferably from 950° C. to 1100° C. in an atmosphere containing HCl as a halogen gas of 0.5 to 10 volume % (preferably 3 volume %) to oxygen. Then, the separation layer 110 is formed as illustrated in FIG. 6B. The separation layer 110 is formed by irradiating the semiconductor substrate 108 with ions accelerated with electric field, similarly to the case of FIG. 2A.

Figure 7A:
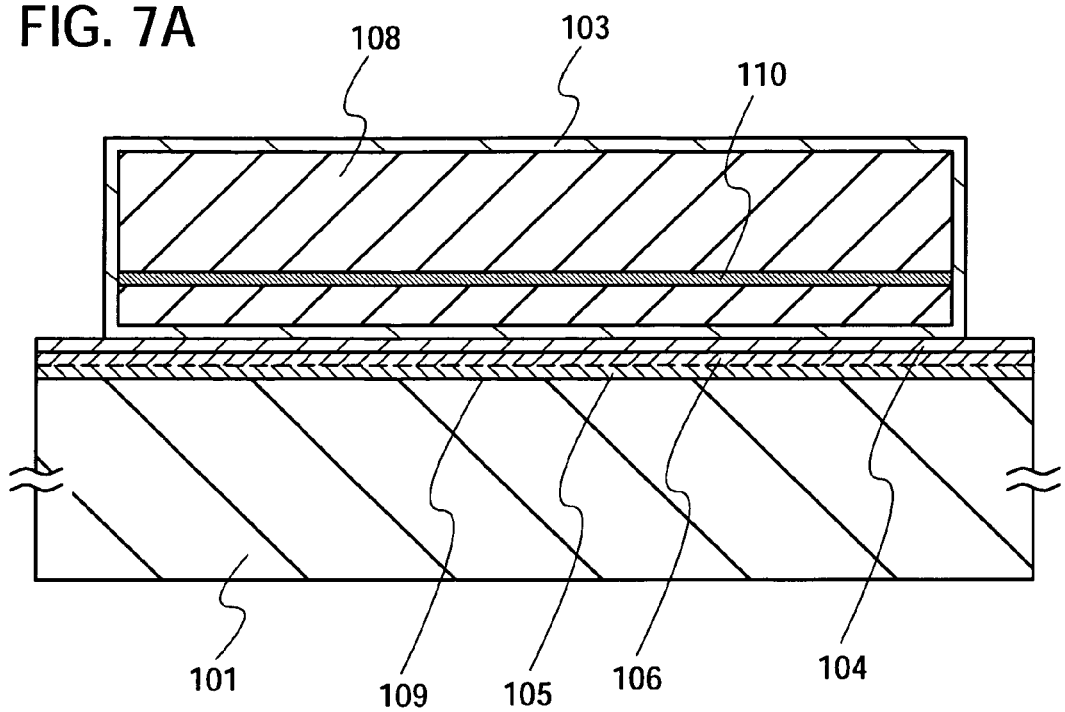
FIGS. 7A and 7B are cross-sectional views of a manufacturing process of a substrate having an SOI structure.

In FIG. 7A, the blocking layer 109 is provided for the support substrate 101. The blocking layer 109 can, for example, formed from the silicon nitride oxide film 105 and the silicon oxynitride film 106. The silicon nitride oxide film 105 has a function of preventing an impurity such as metal contained in the support substrate 101 from diffusing into the single crystal semiconductor layer 102 side. In the manufacturing method illustrated in FIGS. 6A to 8B, before the oxide film 103 and the bonding layer 104 formed on the support substrate 101 are bonded, the silicon nitride oxide film 105 is provided on the side of the support substrate 101, which forms a bonding. Thus, the single crystal semiconductor layer 102 can be prevented from being contaminated by an impurity diffused from the support substrate 101, and further, contamination of the bonding layer 104 can also be prevented, thereby preventing decrease of the bonding strength due to the impurity. The silicon oxynitride film 106 has a function of reducing inner stress of the silicon nitride oxide film 105. By providing the blocking layer 109 having such a stacked structure, contamination due to impurities of the single crystal semiconductor layer 102 can be prevented and further stress distortion can be eased.

The bonding layer 104 is provided over the blocking layer 109. This bonding layer 104 is a layer having a planar surface and a lyophobic surface. An insulating layer which is formed by thermal reaction or chemical reaction is preferable as a layer having such a surface. The bonding layer 104 which is smooth and has a hydrophilic surface is provided with a thickness of 0.2 to 500 nm. With such a thickness, it is possible to smooth surface roughness of a surface on which a film is to be formed and also to ensure smoothness of a growing surface of the film. As the bonding layer 104, a silicon oxide film is preferably formed. The thickness of the silicon oxide film is 10 to 200 nm, preferably 10 to 100 nm, and more preferably 20 to 50 nm. A silicon oxide film is preferably formed by a chemical vapor deposition method with the use of an organic silane gas.

The support substrate 101, over which the blocking layer 109 and the bonding layer 104 are formed, and the semiconductor substrate 108, on which the oxide film 103 is formed, are bonded in close contact with each other. In this case, the bonding is formed by bonding the oxide film 103 and the bonding layer 104. By pressing the support substrate 101 and the semiconductor substrate 108, the bonding strength can be increased by hydrogen bonding.

Figure 7B:
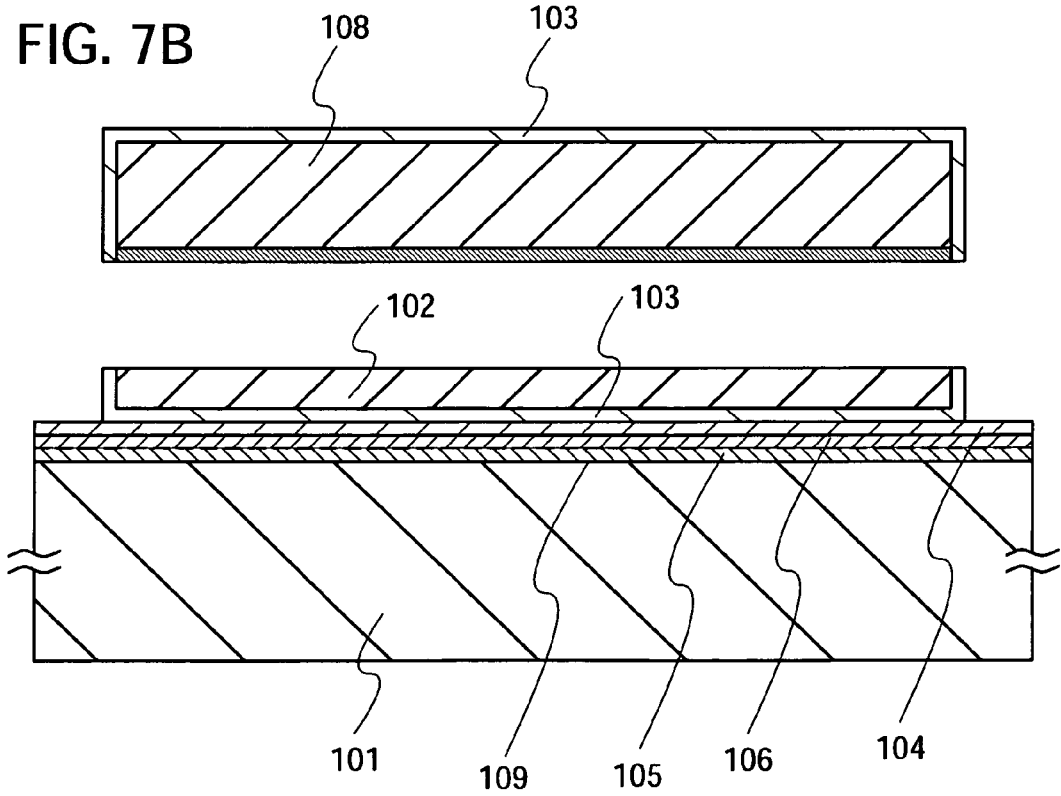

FIG. 7B illustrates a mode in which the single crystal semiconductor layer 102 is formed by separation of a part of the semiconductor substrate by heat treatment. The heat treatment is performed with the semiconductor substrate 108 and the support substrate 101 superposed. The semiconductor substrate 108 is separated from the support substrate 101 by heat treatment with the single crystal semiconductor layer 102 left on the support substrate 101. Heat treatment is preferably performed at a temperature of greater than or equal to a film formation temperature of the bonding layer 104 and lower than the heat resistant temperature of the support substrate 101. For example, heat treatment is performed at a temperature of 400° C. or higher and lower than 600° C., so that the volume of the minute voids which are formed in the separation layer 110 is changed and the semiconductor substrate 108 can be separated along the separation layer 110. Since the bonding layer 104 is bonded to the support substrate 101, the single crystal semiconductor layer 102 having the same crystallinity as the semiconductor substrate 108 is bonded and left on the support substrate 101.

Figure 8A:
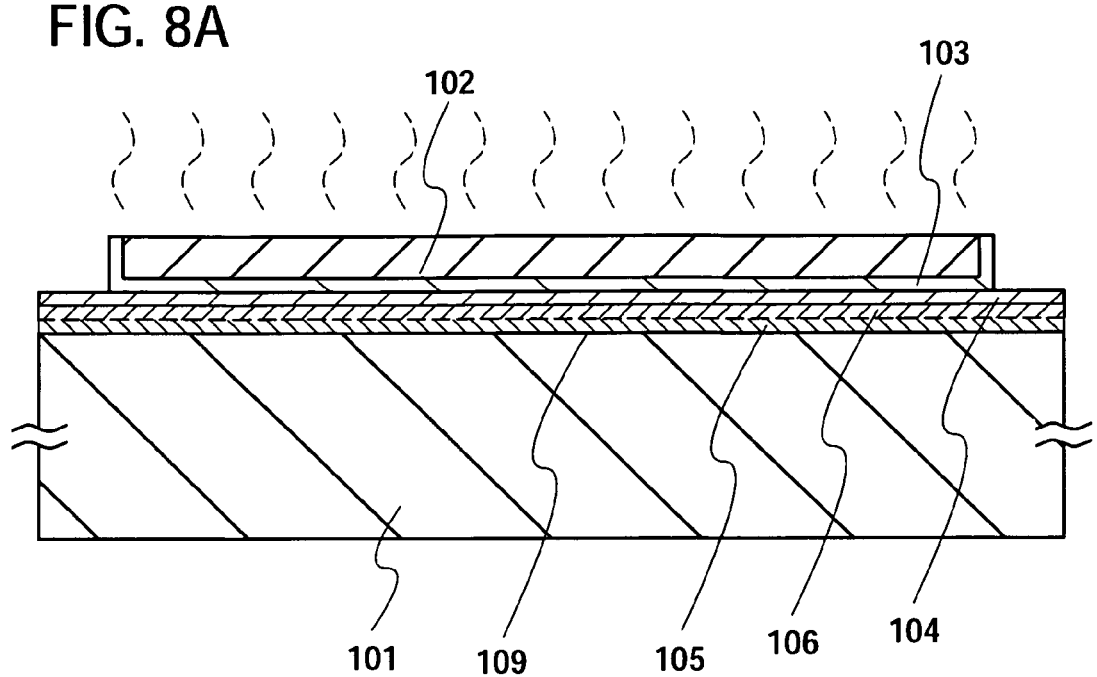
FIGS. 8A and 8B are cross-sectional views of a manufacturing process of a substrate having an SOI structure.
Figure 8B:
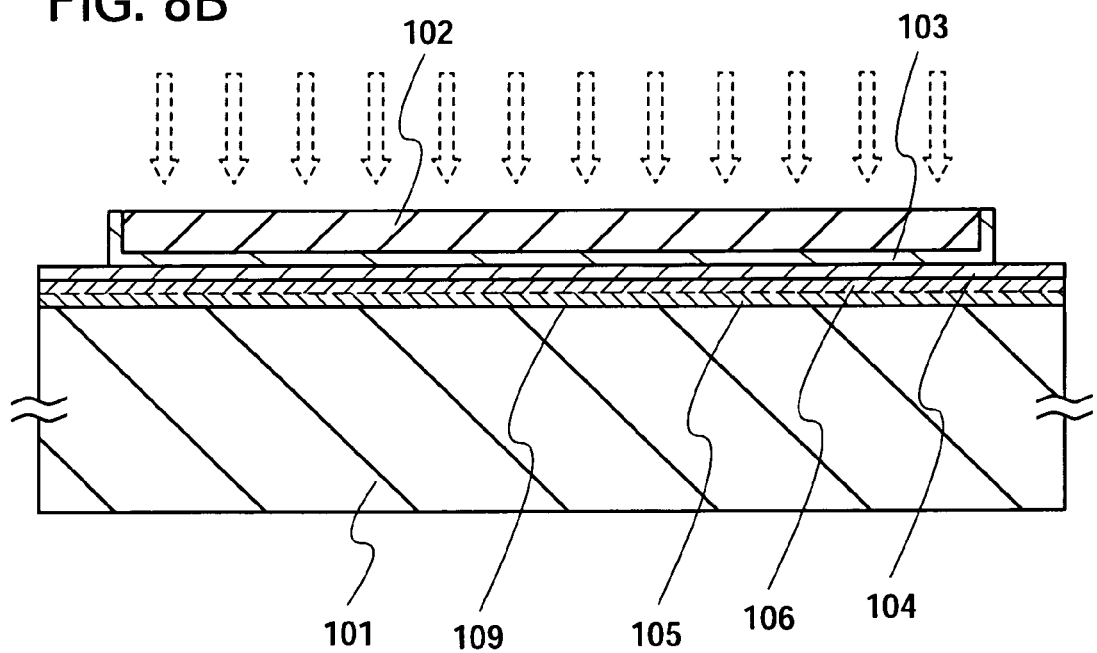

FIG. 8A illustrates a mode in which heat treatment is conducted with the semiconductor layer 102 fixed on the support substrate 101, and the mode is similar to that of FIG. 4A. By such heat treatment, hydrogen bonding at the bonding interface between the support substrate 101 and the single crystal semiconductor layer 102 can be changed into covalent bonding that is stronger than hydrogen bonding. In addition, FIG. 8B illustrates a mode in which the single crystal semiconductor layer 102 is irradiated with energy beam to recover crystal defects, and the mode is similar to that of FIG. 4B.

According to this embodiment mode, even when a substrate having heat resistant temperature of 700° C. or lower, such as a glass substrate is used as the support substrate 101, the single crystal semiconductor layer 102 can have strong adhesion in the bonding portion. As the support substrate 101, a variety type of glass substrates used in the electronics industry, which employs non-alkali glass, such as aluminosilicate glass substrates, aluminoborosilicate glass substrates, and barium borosilicate glass substrates can be applied. In other words, a single crystal semiconductor layer can be formed on a substrate that is longer than one meter on one side. With the use of such a large-area substrate, not only a display device such as a liquid crystal display but also a semiconductor integrated circuit can be manufactured. In addition, as to the semiconductor substrate, thermal oxidation is performed in an atmosphere containing halogen in an initial phase of the process, so that a gettering effect can be obtained, which is effective in reutilizing the semiconductor substrate.

Figure 9A:
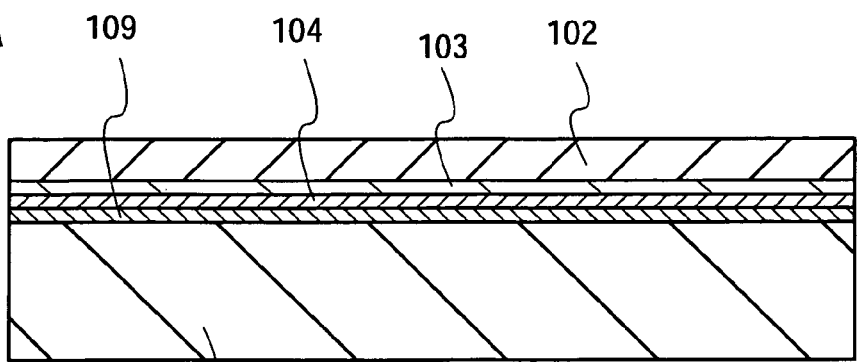
FIGS. 9A to 9D are cross-sectional views of a manufacturing process of a semiconductor device using a substrate having an SOI structure.

Next, a manufacturing method of a semiconductor device using a substrate having an SOI structure of this embodiment mode is described with reference to FIG. 9A to 10B. In FIG. 9A, the oxide film 103 is formed on the single crystal semiconductor layer 102, and the blocking layer 109 and the bonding layer 104 are also formed. The stack in which the layers are formed is bonded to the support substrate 101. The blocking layer 109 may be provided for the support substrate 101 side. By providing the blocking layer 109, the single crystal semiconductor layer 102 can be prevented from being contaminated by an impurity. The blocking layer 109 includes a silicon nitride layer and a silicon nitride oxide layer. Alternatively, for the blocking layer 109, an aluminum nitride layer and an aluminum nitride oxide layer may be applied.

The thickness of the single crystal semiconductor layer 102 is set to be 5 nm to 500 nm, preferably, 10 nm to 200 nm, more preferably, 10 nm to 60 nm. The thickness of the single crystal semiconductor layer 102 can be appropriately set by control of the depth of the separation layer 110 as illustrated in FIG. 2B. To the single crystal semiconductor layer 102, an impurity imparting p-type conductivity such as boron, aluminum, or gallium or an impurity imparting n-type conductivity such as phosphorus or arsenic is preferably added to correspond to a formation region of an n-channel field-effect transistor or a p-channel field-effect transistor. In other words, an impurity imparting p-type conductivity is added to a formation region of an n-channel field-effect transistor or an impurity imparting n-type conductivity is added to a formation region of a p-channel field-effect transistor, whereby a so-called well region is formed. The dose of ions of an impurity imparting n-type conductivity or an impurity imparting p-type conductivity impurity may be approximately $1 \times 10^{12}$ ions/cm$^2$ to $1 \times 10^{14}$ ions/cm$^2$. Furthermore, in the case of controlling the threshold voltage of the field-effect transistors, an impurity imparting n-type conductivity or an impurity imparting p-type conductivity impurity may be added to the well region.

Figure 9B:
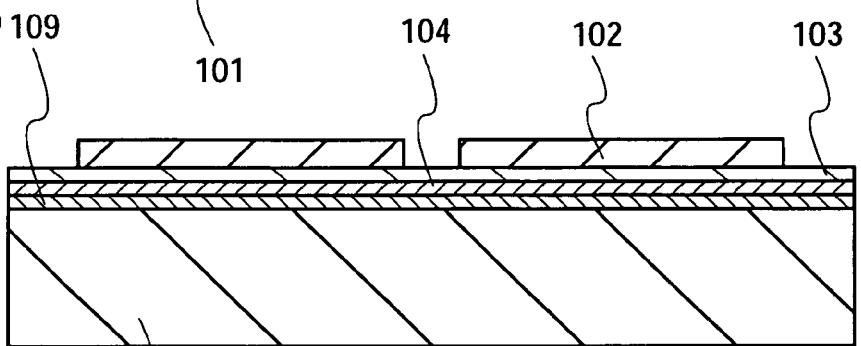
Figure 9C:
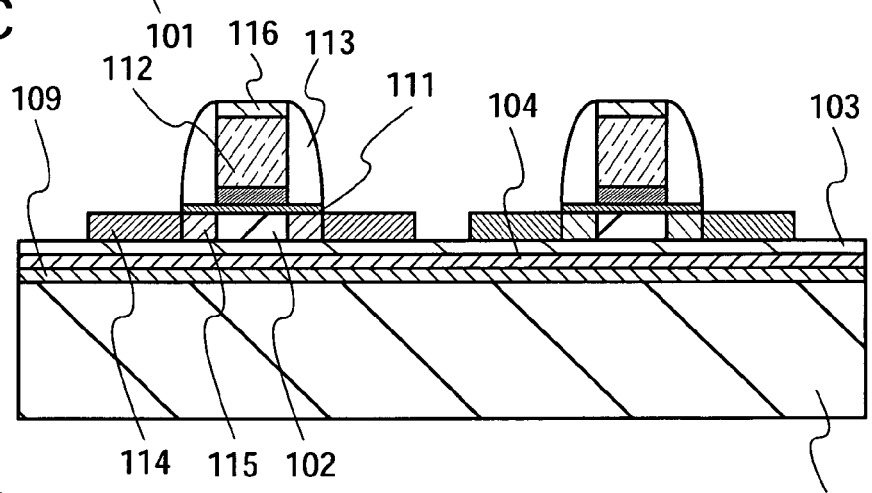

As illustrated in FIG. 9B, the single crystal semiconductor layer 102 is etched to form single crystal semiconductor layers 102 which are isolated in island-like shape from each other to correspond to the arrangement of semiconductor elements. Then, as illustrated in FIG. 9C, a gate insulating layer 111, a gate electrode 112, and a sidewall insulating layer 113 are formed and a first impurity region 114 and a second impurity region 115 are formed. The insulating layer 116 is formed of silicon nitride and is used as a hard mask in etching the gate electrode 112.

Figure 9D:
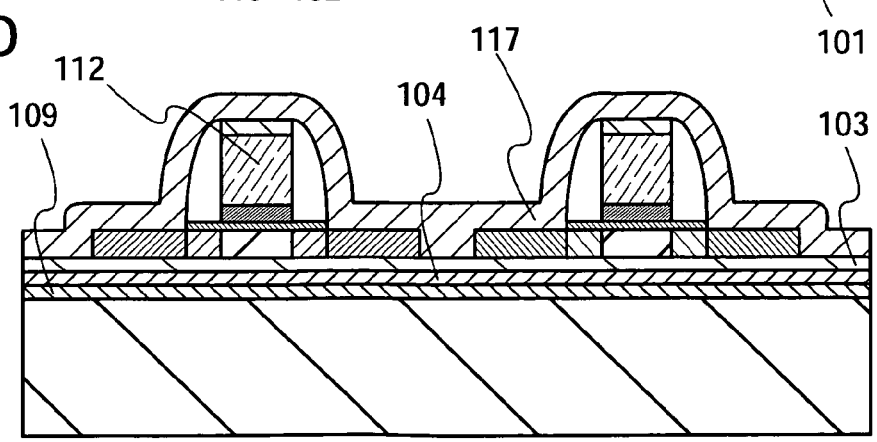

FIG. 9D illustrates a mode in which a protective film 117 is formed after forming the gate electrode 112 and the like. As the protective film 117, a silicon nitride layer or a silicon nitride oxide layer is preferably formed by a plasma CVD method at a substrate temperature of 350° C. or lower during film formation. In other words, the protective film 117 is made to contain hydrogen. After the protective film 117 is formed, hydrogen contained in the protective film 117 is diffused into the single crystal semiconductor layer 102 side by heat treatment at 350° C. to 450° C. (preferably, 400° C. to 420° C.). By supply of hydrogen, which compensates defects during an element formation step, to the single crystal semiconductor layer 102, which have been dehydrogenated in the previous step, such defects as to serve as trapping centers can be compensated effectively. In addition, the blocking layer 109 prevents impurity diffusion from the support substrate 101 side, whereas the protective film 117 is effective in preventing contamination due to impurity diffusion from the upper layer side. In this embodiment mode, an upper layer side and a lower layer side of the single crystal semiconductor layer 102 having excellent crystallinity are covered with insulating layers which are highly effective in preventing highly mobile impurity ions of sodium or the like. Therefore, a great effect in stabilizing the characteristics of a semiconductor element manufactured using the single crystal semiconductor layer 102 is obtained.

Figure 10A:
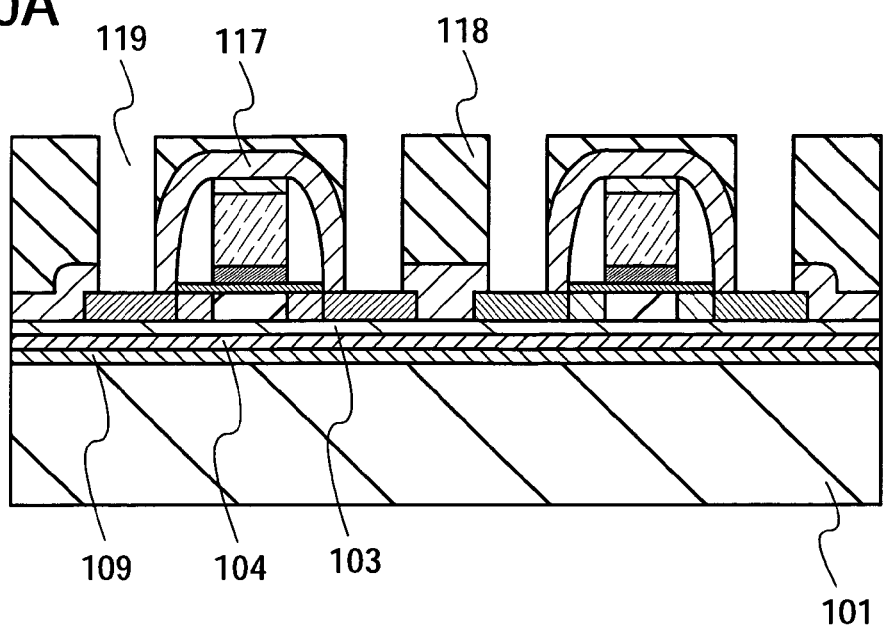
FIGS. 10A and 10B are cross-sectional views of a manufacturing process of a semiconductor device using a substrate having an SOI structure.

After that, an interlayer insulating film 118 is formed as illustrated in FIG. 10A. As the interlayer insulating film 118, a boron phosphorus silicon glass (BPSG) film is formed or an organic resin typified by polyimide is formed by coating. In the interlayer insulating film 118, a contact hole 119 is formed.

Figure 10B:
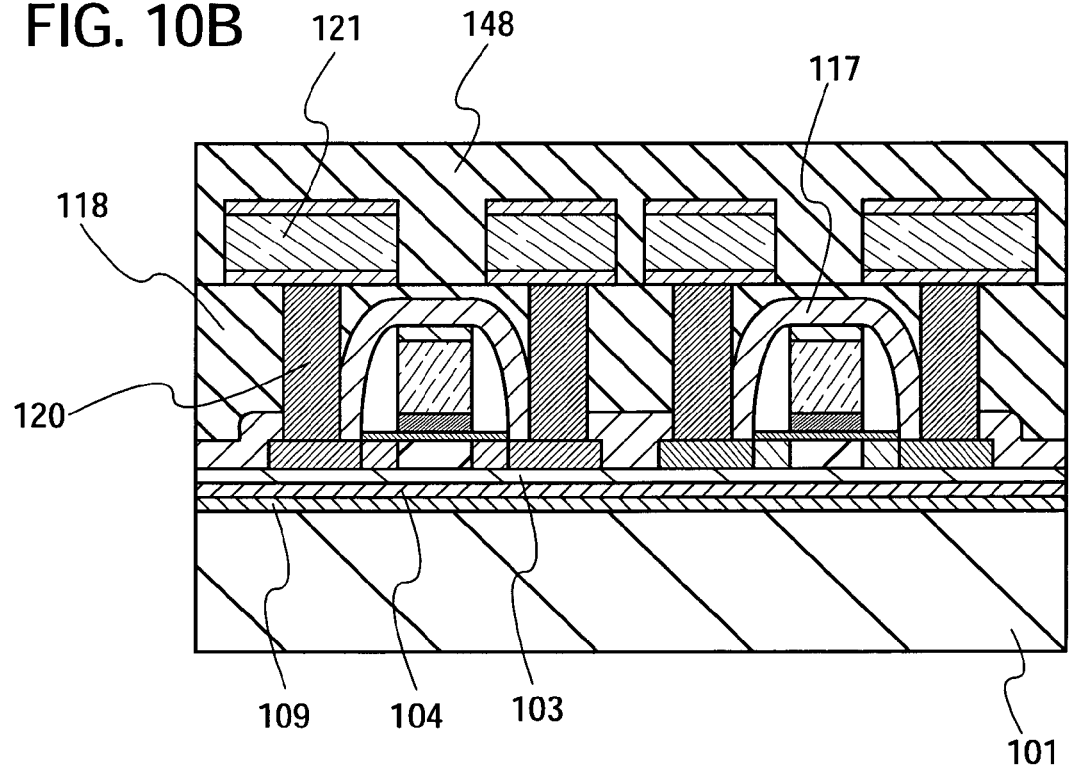

FIG. 10B illustrates a mode in which a wiring is formed. In the contact hole 119, a contact plug 120 is formed. As the contact plug 120, tungsten silicide is formed by a chemical vapor deposition method from a $WF_6$ gas and a $SiH_4$ gas to fill the contact hole 119. Alternatively, tungsten may be formed by hydrogen reduction of a $WF_6$ gas to fill the contact hole 119. After that, a wiring 121 is formed to correspond to the contact plug 120. The wiring 121 is formed of aluminum or an aluminum alloy, and an upper layer and a lower layer thereof are formed using metal layers of molybdenum, chromium, titanium, or the like as barrier metal. Furthermore, an interlayer insulating layer 148 is formed thereover. The wiring may be provided as appropriate, and a multilayer wiring may be formed by further forming a wiring layer thereover. In that case, a damascene process may be employed.

In this manner, field-effect transistors can be manufactured using the single crystal semiconductor layer 102 that are bonded to the support substrate 101. The single crystal semiconductor layer 102 according to this embodiment mode is formed of a single crystal semiconductor that has uniform crystal orientation; therefore, uniform, high-performance field-effect transistors can be obtained. In other words, it is possible to suppress inhomogeneity of values of important transistor characteristics, such as threshold voltage and mobility, and to achieve higher performance such as higher mobility.

In addition, the oxide film 103 that contains a halogen is provided on the back channel side (the side opposite to a gate electrode 112) of the single crystal semiconductor layer 102, and local level density is decreased; therefore, variation of threshold voltage between transistors can be suppressed. Furthermore, the blocking layer 109 as well as the oxide film 103 that contains a halogen is provided between the support substrate 101 and the single crystal semiconductor layer 102; therefore, the single crystal semiconductor layer 102 can be prevented from being contaminated by diffusion of a metal impurity such as sodium from the support substrate 101 side.

Figure 11:
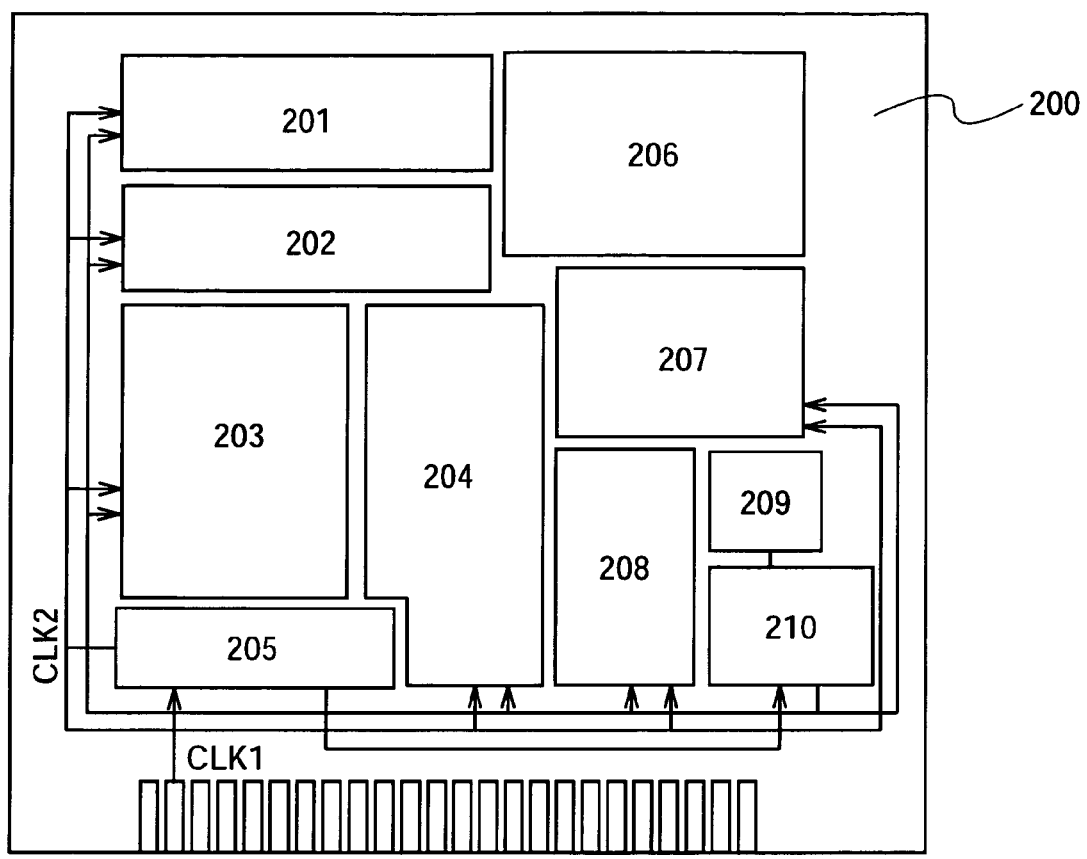
FIG. 11 is a block diagram illustrating a structure of a microprocessor formed using a substrate having an SOI structure.

FIG. 11 illustrates a structure of a microprocessor obtained using a substrate having an SOI structure as an example of a semiconductor device. A microprocessor 200 is manufactured using the SOI substrate formed according to this embodiment mode as described above. This microprocessor 200 has an arithmetic logic unit (ALU) 201, an ALU controller 202, an instruction decoder 203, an interrupt controller 204, a timing controller 205, a register 206, a register controller 207, a bus interface (Bus I/F) 208, a read-only memory (ROM) 209, and a ROM interface (ROM I/F) 210.

An instruction input to the microprocessor 200 through the bus interface 208 is input to the instruction decoder 203, decoded therein, and then is input to the ALU controller 202, the interrupt controller 204, the register controller 207, and the timing controller 205. The ALU controller 202, the interrupt controller 204, the register controller 207, and the timing controller 205 conduct various controls based on the decoded instruction. Specifically, the ALU controller 202 generates signals for controlling the operation of the ALU 201. While the microprocessor 200 is executing a program, the interrupt controller 204 processes an interrupt request from an external input/output device or a peripheral circuit based on its priority or a mask state. The register controller 207 generates an address of the register 206, and reads and writes data from and to the register 206 in accordance with the state of the microprocessor 200. The timing controller 205 generates signals for controlling timing of operation of the ALU 201, the ALU controller 202, the instruction decoder 203, the interrupt controller 204, and the register controller 207. For example, the timing controller 205 is provided with an internal clock generator for generating an internal clock signal CLK2 based on a reference clock signal CLK1, and supplies the internal clock signal CLK2 to the various above-mentioned circuits. Obviously, the microprocessor 200 illustrated in FIG. 11 is merely an example in which the configuration is simplified, and an actual microprocessor may have a wide variety of configurations depending on the uses.

The above-described microprocessor 200 can achieve not only an increase in processing speed but also a reduction in power consumption because an integrated circuit is formed using a single crystal semiconductor layer (SOI layer) with uniform crystal orientation which is bonded to a substrate having an insulating surface or an insulating substrate serving as a support substrate. In addition, since the oxide film containing halogen is formed on a back channel side (on the side opposite to a gate electrode) of the single crystal semiconductor layer used for a transistor constituting a part of the integrated circuit, the local level density is decreased and thus variation of a threshold voltages between transistors can be suppressed. Further, in addition to the oxide film containing halogen, the blocking layer is also formed between the support substrate and the single crystal semiconductor layer, thereby preventing the single crystal semiconductor layer from being contaminated by diffusion of an impurity such as metal of sodium or the like from the support substrate side.

Figure 12:
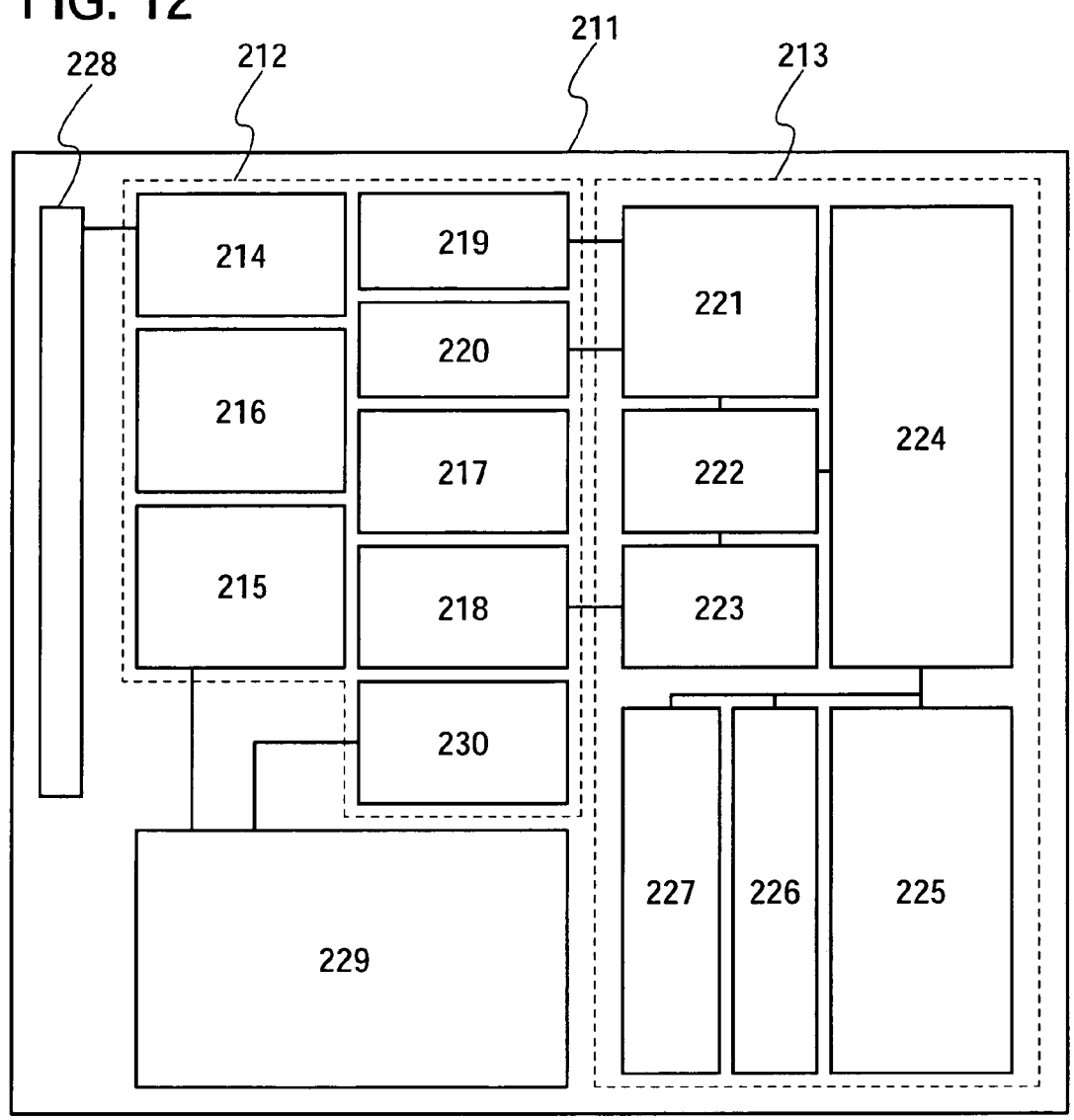
FIG. 12 is a block diagram illustrating a structure of an RFCPU formed using a substrate having an SOI structure.

Next, a structure of an RFCPU obtained using the substrate having an SOI structure is described with reference to FIG. 12 as an example of a semiconductor device having an arithmetic function that enables contactless data transmission and reception. FIG. 12 illustrates an example of a computer that operates to transmit and receive signals to and from an external device by wireless communication (such a computer is hereinafter referred to as an RFCPU). An RFCPU 211 has an analog circuit portion 212 and a digital circuit portion 213. The analog circuit portion 212 has a resonance circuit 214 with a resonance capacitor, a rectifier circuit 215, a constant voltage circuit 216, a reset circuit 217, an oscillator circuit 218, a demodulator circuit 219, a modulator circuit 220, and a power management circuit 230. The digital circuit portion 213 has an RF interface 221, a control register 222, a clock controller 223, a CPU interface 224, a central processing unit (CPU) 225, a random-access memory (RAM) 226, and a read-only memory (ROM) 227.

The operation of the RFCPU 211 having such a configuration is roughly as follows. The resonance circuit 214 generates an induced electromotive force based on a signal received by an antenna 228. The induced electromotive force is stored in a capacitor portion 229 through the rectifier circuit 215. This capacitor portion 229 is preferably formed using a capacitor such as a ceramic capacitor or an electric double layer capacitor. The capacitor portion 229 does not need to be integrated with the RFCPU 211 and it is acceptable as long as the capacitor portion 229 may be mounted as a different component on a substrate having an insulating surface which is included in the RFCPU 211.

The reset circuit 217 generates a signal for resetting and initializing the digital circuit portion 213. For example, the reset circuit 217 generates a signal which rises after rise in the power supply voltage with delay as a reset signal. The oscillator circuit 218 changes the frequency and duty ratio of a clock signal in response to a control signal generated by the constant voltage circuit 216. The demodulator circuit 219 formed using a low-pass filter binarizes the amplitude variability of, for example, a received amplitude-modulated (ASK) signal. The modulator circuit 220 varies the amplitude of an amplitude-modulated (ASK) transmission signal and transmits the signal. The modulator circuit 220 changes the amplitude of a communication signal by changing a resonance point of the resonance circuit 214. The clock controller 223 generates a control signal for changing the frequency and duty ratio of a clock signal in accordance with the power supply voltage or a consumption current of the central processing unit 225. The power supply voltage is managed by the power management circuit 230.

A signal input from the antenna 228 to the RFCPU 211 is demodulated by the demodulator circuit 219 and then decomposed into a control command, data, and the like by the RF interface 221. The control command is stored in the control register 222. The control command includes reading of data stored in the read-only memory 227, writing of data to the random-access memory 226, an arithmetic instruction to the central processing unit 225, and the like. The central processing unit 225 accesses the read-only memory 227, the random-access memory 226, and the control register 222 via the CPU interface 224. The CPU interface 224 has a function of generating an access signal for any of the read-only memory 227, the random-access memory 226, and the control register 222 based on an address the central processing unit 225 requests.

As an arithmetic method of the central processing unit 225, a method may be employed in which the read-only memory 227 stores an operating system (OS) and a program is read and executed at the time of starting operation. Alternatively, a method may be employed in which a dedicated arithmetic circuit is provided and arithmetic processing is conducted using hardware. In a method in which both hardware and software are used, part of processing is conducted by a dedicated arithmetic circuit and the other part of the arithmetic processing is conducted by the central processing unit 225 using a program.

The above-described RFCPU 211 can achieve not only an increase in processing speed but also a reduction in power consumption because an integrated circuit is formed using a single crystal semiconductor layer (SOI layer) with uniform crystal orientation which is bonded to a substrate having an insulating surface or an insulating substrate serving as a support substrate. This makes it possible to ensure the operation for a long period of time even when the capacitor portion 229 which supplies power is downsized. In addition, since the oxide film containing halogen and the blocking layer are provided between the support substrate and the single crystal semiconductor layer. By providing the oxide film containing halogen, the local level density is decreased and thus variation of threshold voltage between transistors can be suppressed. By providing the blocking layer, the single crystal semiconductor layer can be prevented from being contaminated by diffusion of an impurity from the support substrate side. FIG. 12 illustrates the mode of the RFCPU, but for example, a substrate having an SOI structure may be used for a semiconductor device having a communication function, an arithmetic function and a memory function, such as an IC tag.

Figure 13:
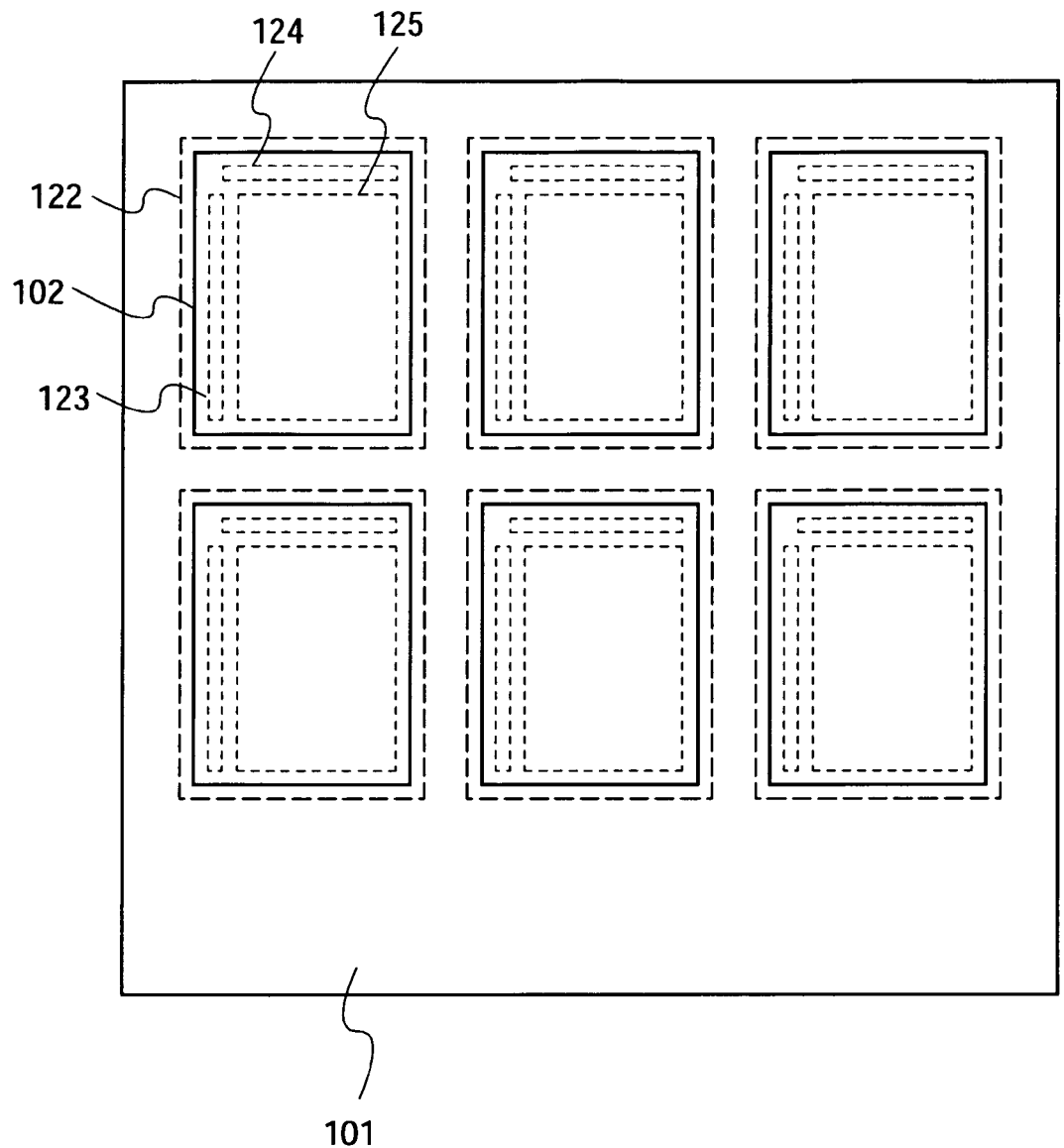
FIG. 13 is a plan view of a case in which single crystal semiconductor layers are bonded to a mother glass for manufacturing a display panel.

A single crystal semiconductor layer according to this embodiment mode can be bonded to a large-sized glass substrate called mother glass used to manufacture a display panel. FIG. 13 illustrates the case where the single crystal semiconductor layers 102 are bonded to a mother glass used as a support substrate 101 for manufacturing a display panel. A plurality of display panels is taken out from the mother glass, and the single crystal semiconductor layers 102 are preferably bonded to match formation regions of display panels 122. Since a mother glass substrate has a larger area than a semiconductor substrate, it is preferable that a plurality of single crystal semiconductor layers 102 be each arranged within the formation regions of the display panels 122 as shown in FIG. 13. Accordingly, even if the plurality of single crystal semiconductor layers 102 is arranged over the support substrate 101, a sufficient space can be provided between adjacent single crystal semiconductor layers 102. Each of the display panels 122 includes a scan line driver circuit region 123, a signal line driver circuit region 124, and a pixel formation region 125. The single crystal semiconductor layer 102 is bonded to the support substrate 101 so as to include these regions.

Figure 14A:
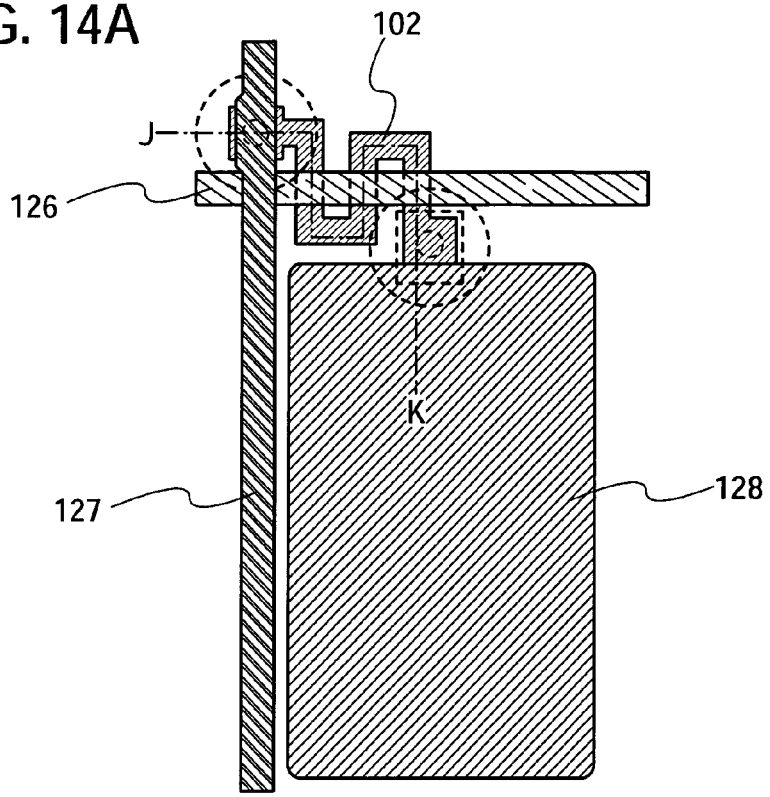
FIGS. 14A and 14B illustrate an example of a liquid crystal display device including a pixel transistor formed using a single crystal semiconductor layer.
Figure 14B:
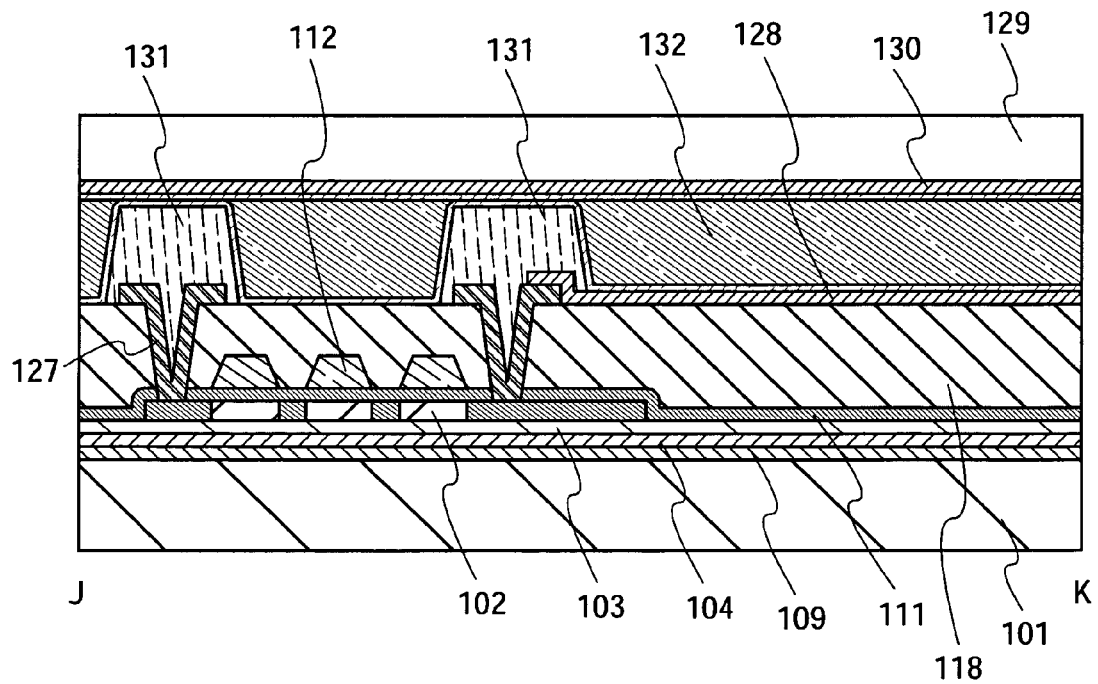

FIGS. 14A and 14B illustrate an example of a pixel of a liquid crystal display device in which a pixel transistor is formed using a single crystal semiconductor layer. FIG. 14A is a plan view of a pixel, in which a scan line 126 intersects the single crystal semiconductor layer 102 and a signal line 127 and a pixel electrode 128 are connected to the single crystal semiconductor layer 102. FIG. 14B is a cross-sectional view taken along the line J-K of FIG. 14A.

In FIG. 14B, a pixel transistor has a stacked structure in which the blocking layer 109, the bonding layer 104, the oxide film 103, and the single crystal semiconductor layer 102 are stacked over the support substrate 101. The pixel electrode 128 is provided over an interlayer insulating film 118. In a contact hole provided in the interlayer insulating film 118, the single crystal semiconductor layer 102 and the signal line 127 are connected to each other, and thus, a columnar spacer 131 is provided in the contact hole so as to fill the concave step generated in etching the interlayer insulating film 118. A counter substrate 129 is provided with a counter electrode 130. A liquid crystal layer 132 is formed in a space formed by the columnar spacer 131.

Figure 15A:
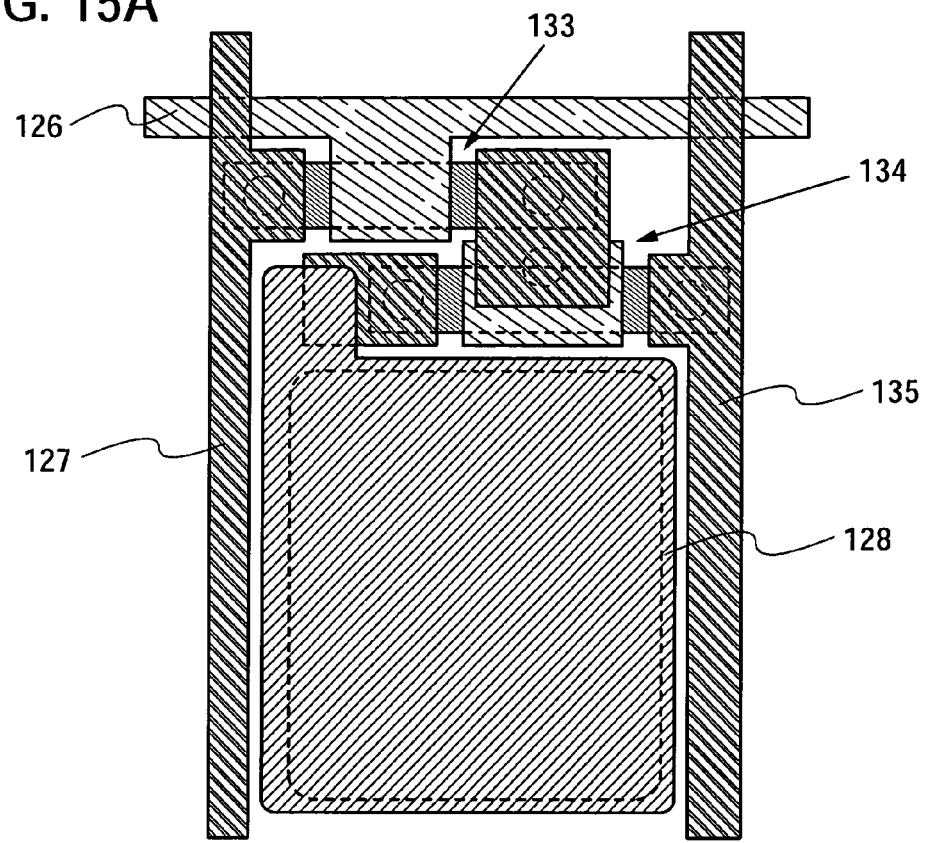
FIGS. 15A and 15B illustrate an example of an electroluminescent display device including a pixel transistor formed using a single crystal semiconductor layer.
Figure 15B:
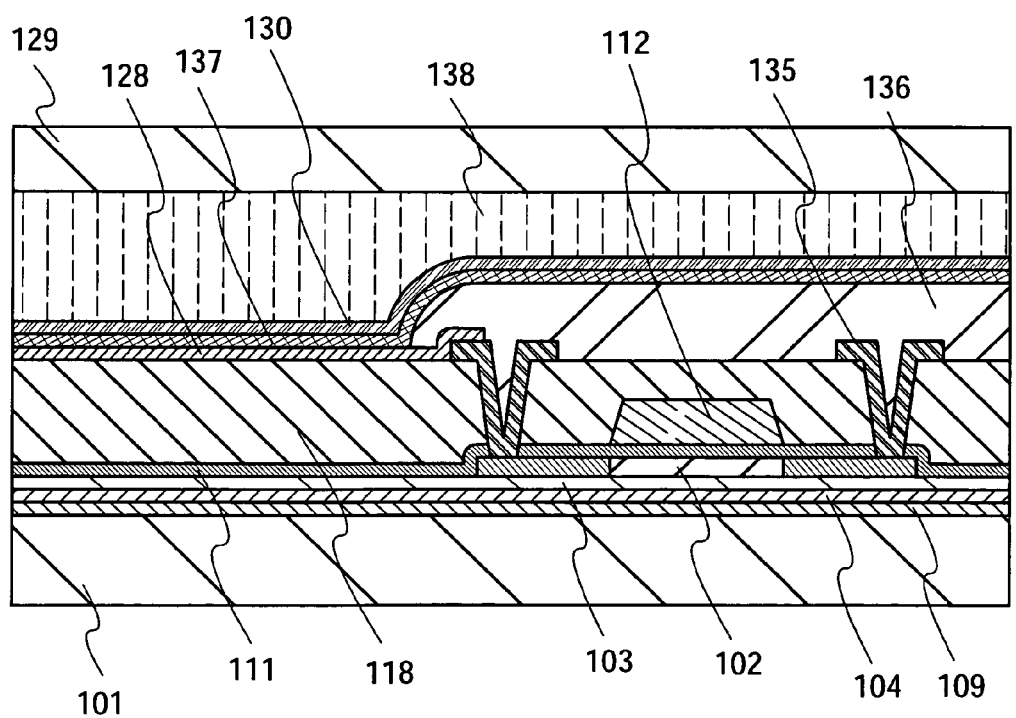

FIGS. 15A and 15B illustrate an example of an electroluminescent display device including pixel transistors formed using a single crystal semiconductor layer. FIG. 15A shows a plan view of a pixel, which has a selection transistor 133 connected to a signal line 127 and a display control transistor 134 connected to a power supply line 135 as the pixel transistors. This display device has a structure in which each pixel is provided with a light emitting element that has a layer (EL layer) formed to contain an electroluminescent material between electrodes. A pixel electrode 128 is connected to the display control transistor 134. FIG. 15B is a cross-sectional view showing a structure of the display control transistor as a main portion of such a pixel.

In FIG. 15B, the display control transistor has a stacked structure in which the blocking layer 109, the bonding layer 104, and the oxide film 103, and the single crystal semiconductor layer 102 are stacked over the support substrate 101. The structures of the blocking layer 109, the bonding layer 104, and the oxide film 103, the single crystal semiconductor layer 102, the interlays insulating film 118 and the like are similar to those in FIG. 14B. A peripheral portion of the pixel electrode 128 is surrounded by an insulating partition layer 136. Over the pixel electrode 128, an EL layer 137 is formed. Over the EL layer 137, a counter electrode 130 is formed. The pixel portion is filled with a sealing resin 138 and is provided with a counter substrate 129 as a reinforcing plate.

In the electroluminescent display device of this embodiment mode, such pixels are arranged in matrix to form a display screen. In this case, a channel portion of each pixel transistor is formed using the single crystal semiconductor layer 102. Therefore, there are advantages in that characteristics do not vary from transistor to transistor and emission luminescence does not vary from pixel to pixel. Therefore, drive with the brightness of a light emitting element being controlled by a current becomes easy, and a correction circuit that corrects variation of transistor characteristics becomes unnecessary. Thus, a load on a driver circuit can be reduced. Furthermore, because a light-transmitting substrate such as glass can be selected as the support substrate 101, a bottom-emission electroluminescent display device which emits light from the support substrate 101 side can be formed.

As described above, a transistor can be formed also over mother glass which is used for manufacturing display panels, by using a single crystal semiconductor layer. The transistor formed using the single crystal semiconductor layer is superior to a transistor formed using amorphous silicon in many operating characteristics such as current drive capability; therefore, the transistor can be downsized. Accordingly, an aperture ratio of a pixel portion in a display panel can be increased. Furthermore, since a microprocessor like the one illustrated in FIG. 11 or an RFCPU like the one illustrated in FIG. 12 can be formed in a display device having such a display panel, the display device can be provided with a function as a computer. Moreover, a display which is capable of data input and output without contact can be manufactured.

Figure 16A:
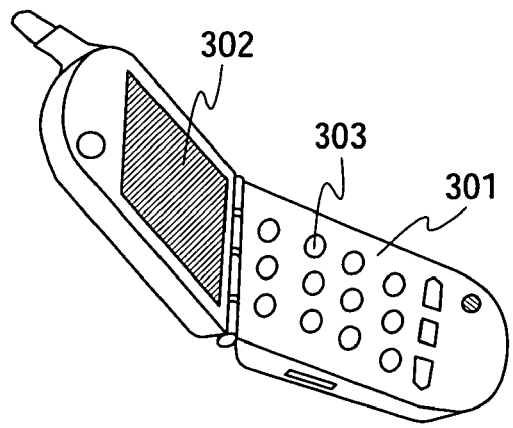
FIGS. 16A to 16C illustrate examples of electronic devices according to an aspect of the present invention.
Figure 16B:
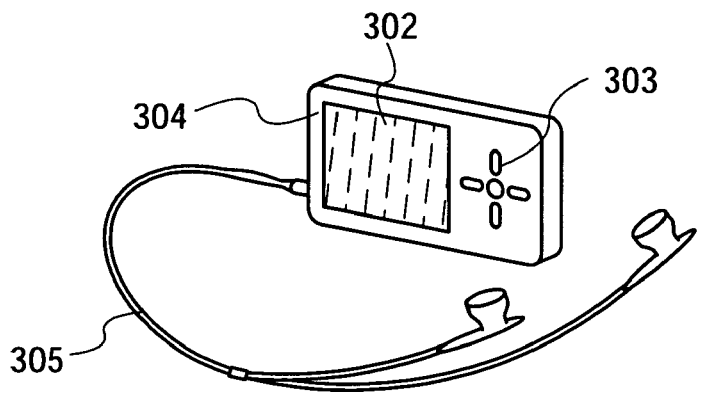
Figure 16C:
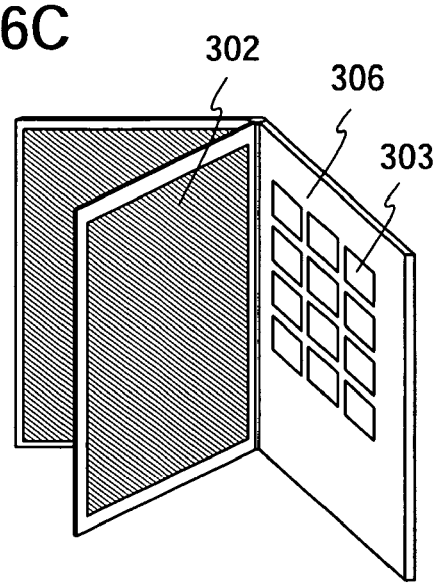

By using a substrate having an SOI structure according to the present invention, a variety of electronic devices can be formed. Examples of electronic devices include a camera such as a video camera or a digital camera, a navigation system, a sound reproducing device (a car audio, an audio component, or the like), a computer, a game machine, a portable information terminal (a mobile computer, a cellular phone, a mobile game machine, an electronic book, or the like), an image reproducing device having a recording medium (specifically, a device for reproducing content of a recording medium such as a digital versatile disc (DVD) and having a display for displaying the reproduced image), and the like. FIGS. 16A to 16C illustrates examples of electronic devices according to the present invention.

FIG. 16A shows an example of a cellular phone 301. This cellular phone 301 has a display portion 302, operation switches 303, and the like. In the display portion 302, the liquid crystal display device described with reference to FIGS. 14A and 14B or the electroluminescent display device described with reference to FIGS. 15A and 15B can be used. With the use of the display device of this embodiment mode, a display portion with little display unevenness and high image quality can be formed. In addition, of the semiconductor device of this embodiment mode can be used for a microprocessor or a memory which is included in the cellular phone 301.

FIG. 16B shows a digital player 304, which is a typical example of an audio device. The digital player 304 shown in FIG. 16B has a display portion 302, operation switches 303, earphones 305, and the like. Instead of the earphones 305, headphones or wireless earphones can be used. In the digital player 304, the semiconductor device of this embodiment mode can be used for a memory portion which stores music information or a microprocessor which operates the digital player 304. The digital player 304 having this structure can achieve reductions in size and weight. By application of the liquid crystal display device described with reference to FIGS. 14A and 14B or the electroluminescent display device described with reference to FIGS. 15A and 15B to the display portion 302, the display portion 302 can display an image or textual information with high definition even if it has a screen size of about 0.3 inches to 2 inches.

FIG. 16C illustrates an electronic book 306. This electronic book 306 has a display portion 302, operation switches 303 and the like. A modem may be built in, or a structure in which information can be transmitted and received wirelessly may be employed. In the electronic book 306, the semiconductor device of this embodiment mode can be used for a memory portion which stores information or a microprocessor which operates the electronic book 306. In the memory portion, a NOR-type nonvolatile memory with a memory capacity of 20 gigabytes (GB) to 200 gigabytes (GB) can be used, with which images or sounds (music) can be stored and reproduced. By application of the liquid crystal display device described with reference to FIGS. 14A and 14B or the electroluminescent display device described with reference to FIGS. 15A and 15B to the display portion 302, the display portion 302 can perform display with high image quality.

EXAMPLES

Example 1

The present invention will now be described in detail in Examples. The present invention is not limited to Examples, and it is needless to say that the present invention is specified by the scope of claims.

Example 1 shows results obtained by analyzing chlorine contained in an oxide film provided for a single crystal silicon substrate.

A manufacturing method of the oxide film used in this example (hereinafter, it is also referred to as "the oxide film of this example") is described below. Thermal oxidation was conducted in an oxidation atmosphere containing HCl to form an oxide film having a thickness of 100 nm on the single crystal silicon substrate. The thermal oxidation was conducted in an atmosphere in which a hydrogen chloride gas of 150 sccm was introduced to a flow rate 5 SLM of an oxygen gas at 1000° C. for 1 hour and 35 minutes. Then, as a cap film for measurement, a silicon oxynitride film was formed to a thickness of 100 nm.

In this example, as a comparison example, in an oxidation atmosphere to which HCl is not added, the single crystal silicon substrate was subjected to thermal oxidation to form an oxide film (hereinafter, referred to as a comparative oxide film). The thermal oxidation was conducted at a flow rate for oxygen gas of 5 SLM and at a temperature of 1000° C. Note that the time for thermal oxidation was set to 2 hours and 40 minutes in order that the comparative oxide film can have a thickness equal to that of the oxide film of this example. Then, as a cap film for measurement, a silicon oxynitride film was formed to a thickness of 100 nm.

The oxide film of this example and the comparative oxide film were subjected to measurement using a secondary ion mass spectrometry (SIMS) such that distributions of chlorine and hydrogen contained in the oxide films were observed.

Figure 17:
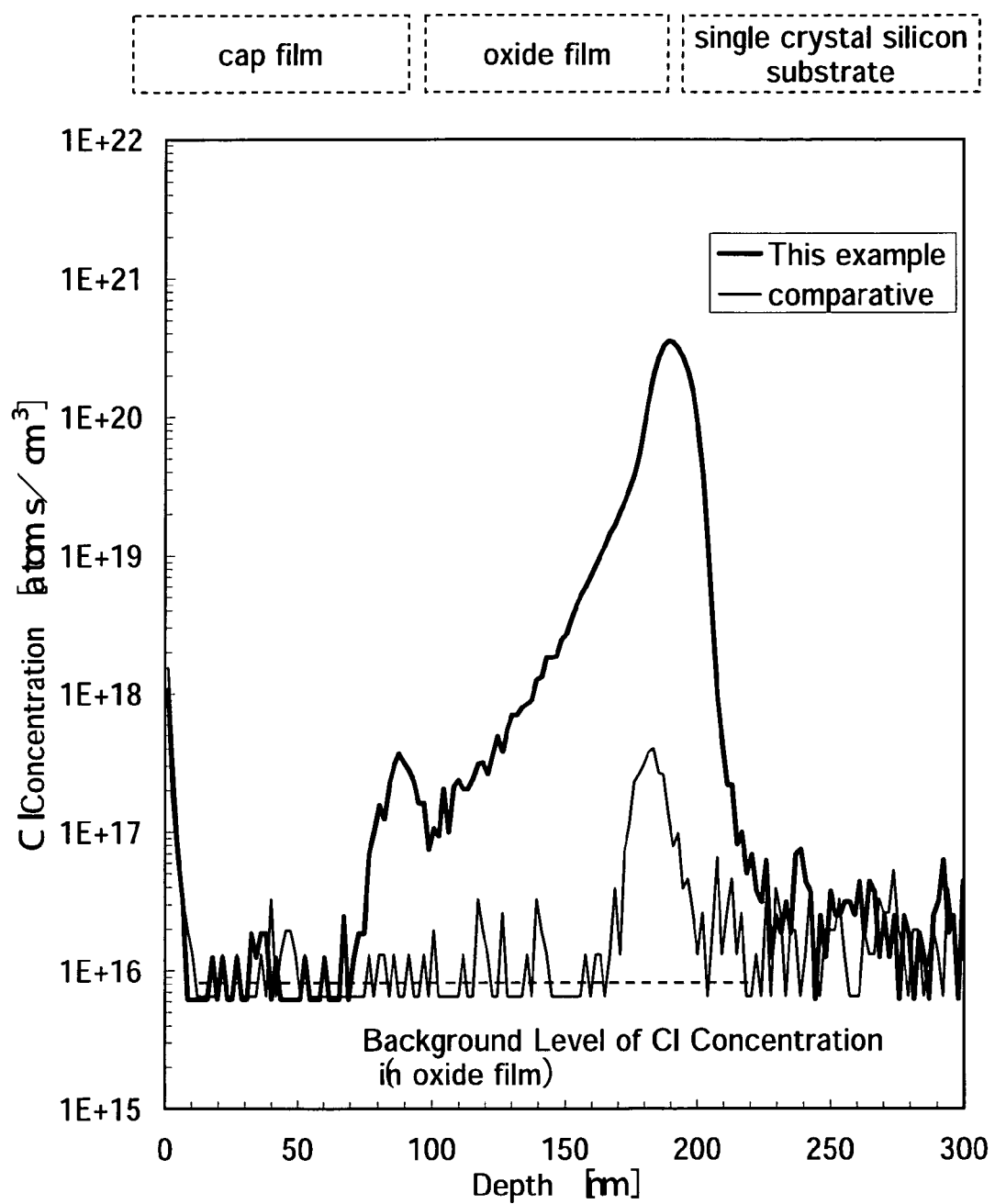
FIG. 17 is a graph of a profile of Cl concentration in a depth direction by SIMS measurement.
Figure 18:
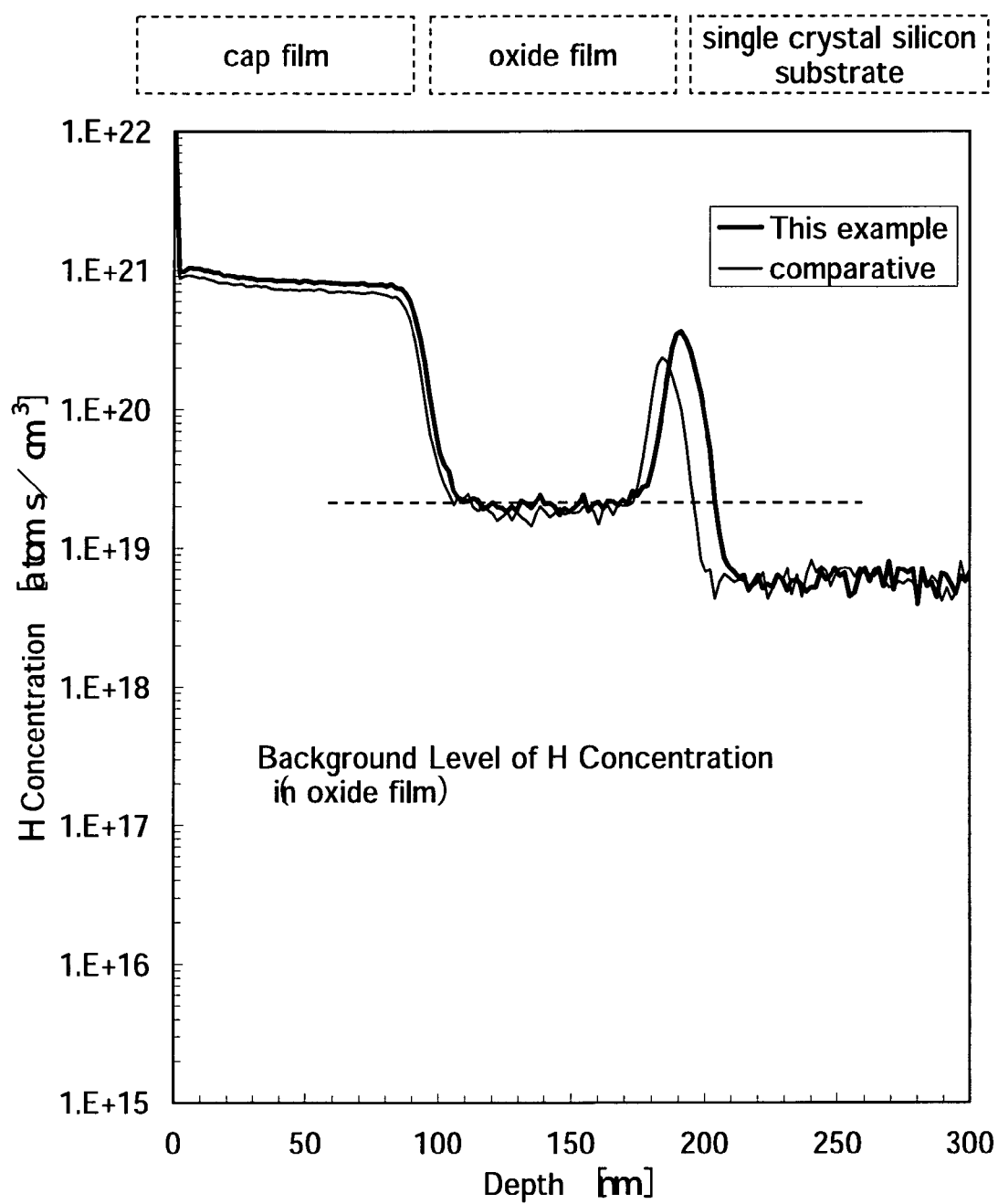
FIG. 18 is a graph of a profile of H concentration in a depth direction by SIMS measurement.

FIG. 17 and FIG. 18 are graphs showing a profile of Cl concentration in the depth direction and a profile of H concentration in the depth direction, respectively. Note that values of the Cl concentration and H concentration are effective only in the oxide films, in FIGS. 17 and 18.

As shown in FIG. 17, the distribution of the Cl concentration in the oxide film of this example has a gradient. The chlorine contained in the oxide film is distributed such that the concentration of chlorine is increased toward the interface between the single crystal silicon substrate and the oxide film, and the concentration is the highest near the interface, about $4\times10^{20}/cm^3$. Thus, by conducting thermal oxidation to the single crystal silicon substrate in the oxidation atmosphere containing HCl, an oxide film containing much chlorine near the interface between the oxide film and the single crystal silicon substrate can be formed.

Note that there is no particular difference as the distribution between H concentration of the oxide film of this example and H concentration of the comparative oxide film as seen from FIG. 18.

Example 2

Example 2 will describe electric characteristics of a transistor formed by steps of providing an oxide film on a single crystal silicon layer by thermal oxidation in an atmosphere containing HCl and forming the transistor using the single crystal silicon layer.

The transistor used in this example (hereinafter, referred to as "a transistor of this example") has a structure in which an oxide film is provided on a single crystal semiconductor layer, a silicon nitride oxide film and a silicon oxide film are formed between the oxide film and a glass substrate, and the single crystal semiconductor layer is bonded to the glass substrate with a silicon oxide film formed on the glass substrate interposed therebetween. The thickness of the oxide film is 50 nm, and the oxide film was formed by conducting thermal oxidation to the single crystal semiconductor layer in an oxidation atmosphere containing HCl. The silicon oxide film was formed using tetraethoxysilane as an organic silane gas by a chemical vapor deposition method. After bonding, the single crystal semiconductor layer was irradiated with an energy beam having an energy density of 685 mJ/cm² or 690 mJ/cm². Further, channel doping was conducted to control a threshold value. Hereinafter, a transistor formed using a single crystal semiconductor layer doped with an impurity imparting an n-type conductivity of $1\times10^{17}$ ions/cm² is referred to as an n-channel transistor of this example, and a transistor formed using a single crystal semiconductor layer doped with an impurity imparting a p-type conductivity of $1\times10^{17}$ ions/cm² is a p-channel transistor of this example.

The transistor used for comparison (hereinafter, referred to as "a comparative transistor") has a structure in which a silicon oxynitride film is formed on a single crystal semiconductor layer, a silicon nitride oxide film and a silicon oxide film are formed between the silicon oxynitride film and a glass substrate, and the single crystal semiconductor layer is bonded to the glass substrate with a silicon oxide film formed on the glass substrate interposed therebetween. The thickness of the silicon oxynitride film was 50 nm so as to correspond to the thickness of the oxide film of this example. In addition, the silicon oxide film was formed in a similar way to that of the transistor of this example. After bonding, the single crystal semiconductor layer was irradiated with an energy beam having an energy density of 685 mJ/cm² or 690 mJ/cm², similar to the method of forming the transistor of this example. Further, channel doping was conducted to the single crystal semiconductor layer of the comparative transistor in such a dosage condition that the comparative transistor had a threshold value close to that of the transistor of this example. Hereinafter, a transistor formed using a single crystal semiconductor layer doped with an impurity imparting an n-type conductivity of $2\times10^{17}$ ions/cm² is referred to as a comparative n-channel transistor (1), a transistor formed using a single crystal semiconductor layer doped with an impurity imparting an n-type conductivity of $3\times10^{17}$ ions/cm² is referred to as a comparative n-channel transistor (2), and a transistor formed using a single crystal semiconductor layer doped with an impurity imparting a p-type conductivity of $3\times10^{17}$ ions/cm² is a comparative p-channel transistor.

FIG. 19A to FIG. 21B show measurement results of electric characteristics of the transistors formed through the above steps.

Figure 19A:
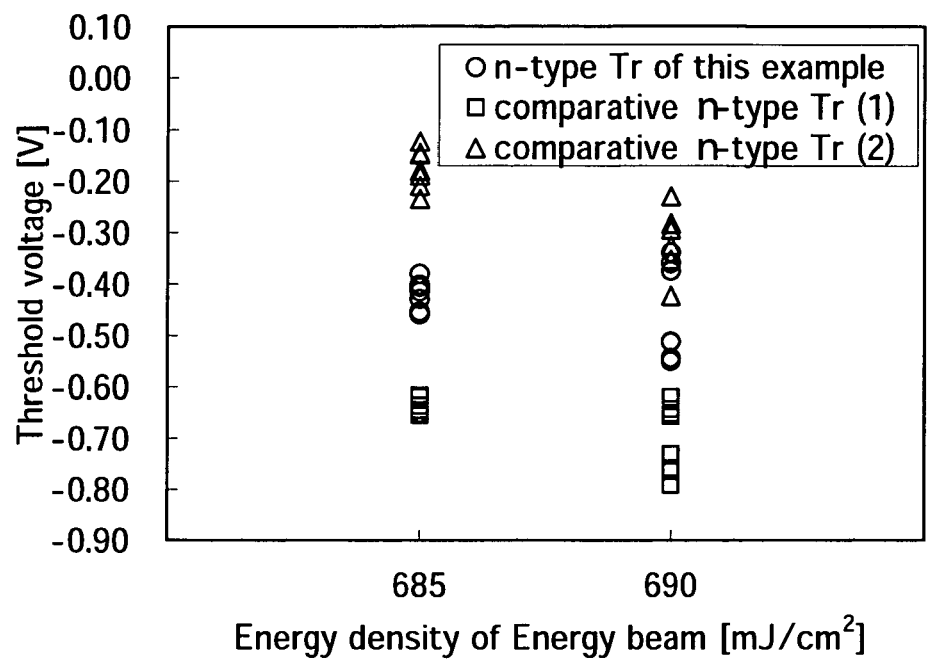
FIGS. 19A and 19B are graphs of electric characteristics (threshold voltage) of transistors.
Figure 19B:
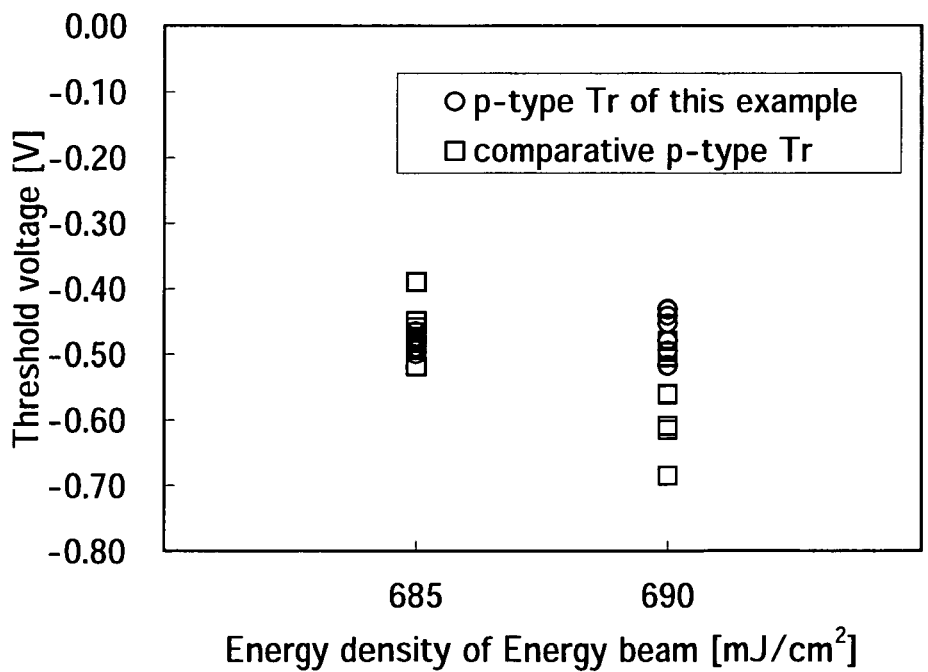

FIGS. 19A and 19B are graphs showing threshold voltages (the unit is V).

Figure 20A:
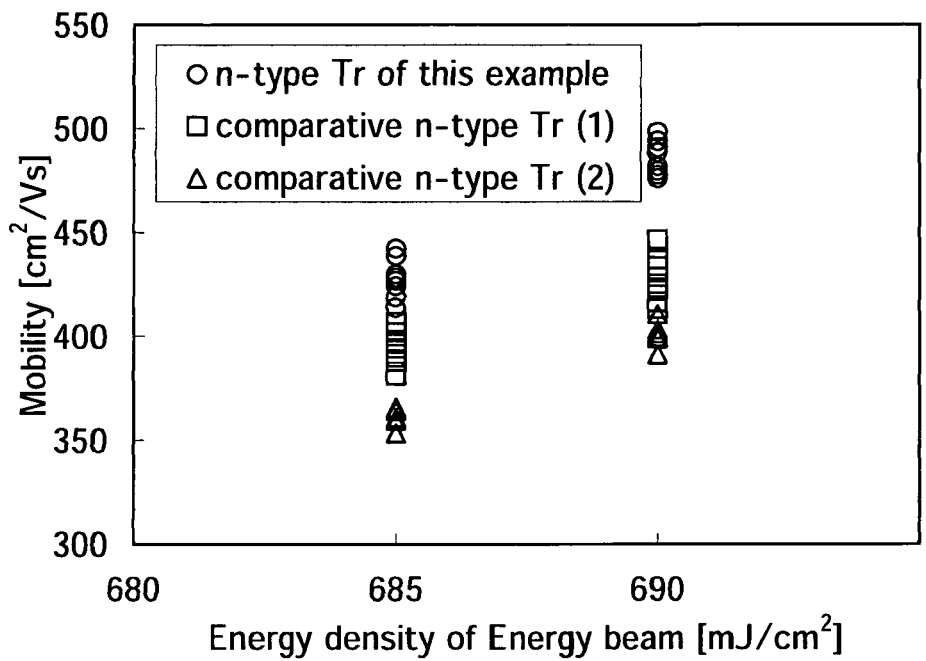
FIGS. 20A and 20B are graphs of electric characteristics (field-effect mobility) of transistors.
Figure 20B:
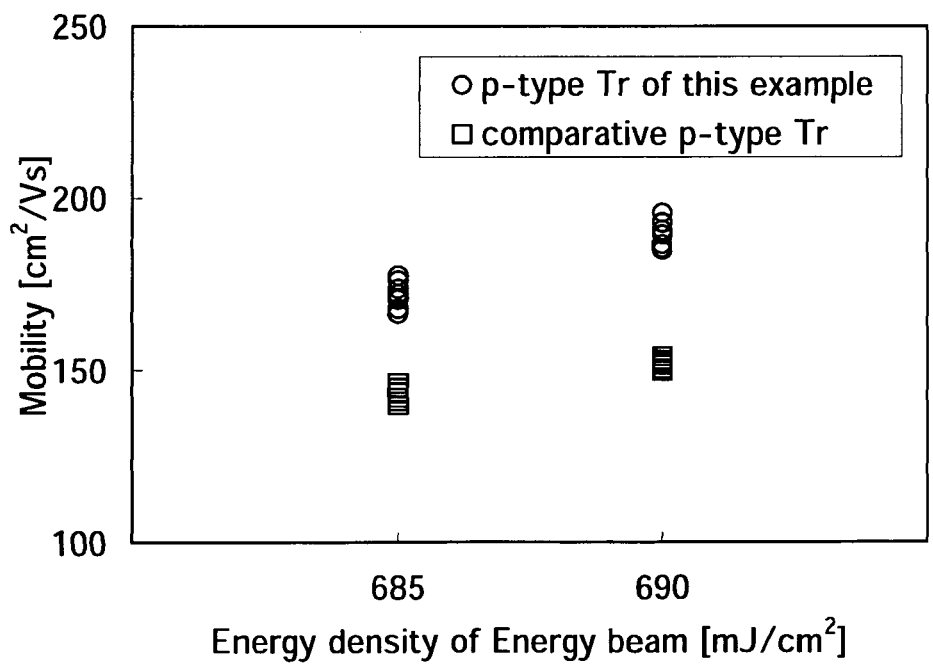

FIGS. 20A and 20B show measurement results of electron field-effect motilities ($\mu$FE, the unit is cm²/Vs). From FIGS. 20A and 20B, it is found that the transistors of this example have electron field-effect motilities higher than the comparative transistors. For example, the n-channel transistor of this example and the p-channel transistor of this example, which were formed by irradiation with the energy beam having an energy density of 690 mJ/cm², have an electron field-effect mobility of 480 cm²/Vs or higher, and an electron field-effect mobility of 185 cm²/Vs or higher, respectively.

Figure 21A:
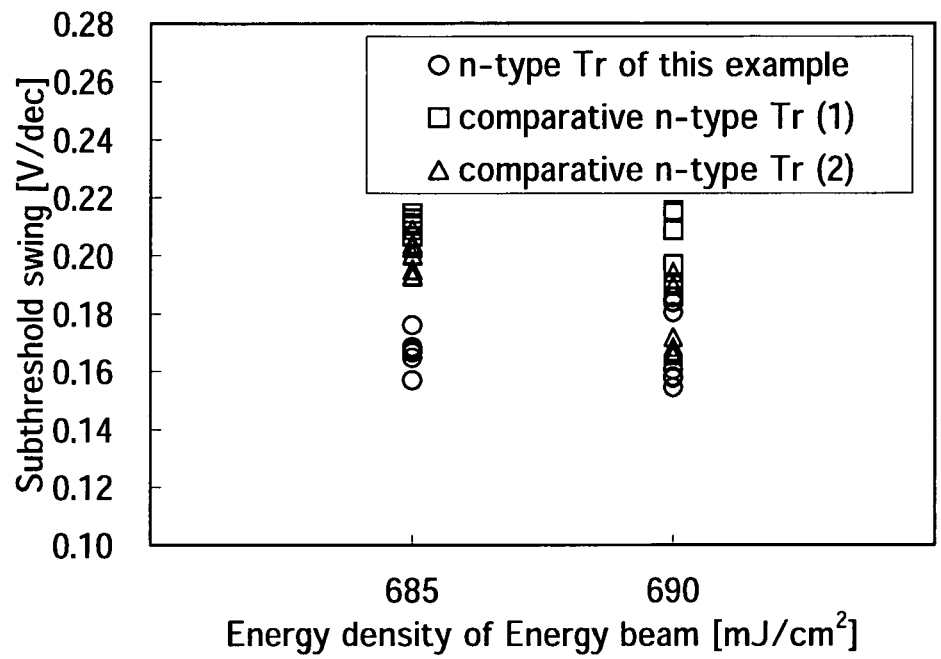
FIGS. 21A and 21B are graphs of electric characteristics (subthreshold swing) of transistors.
Figure 21B:
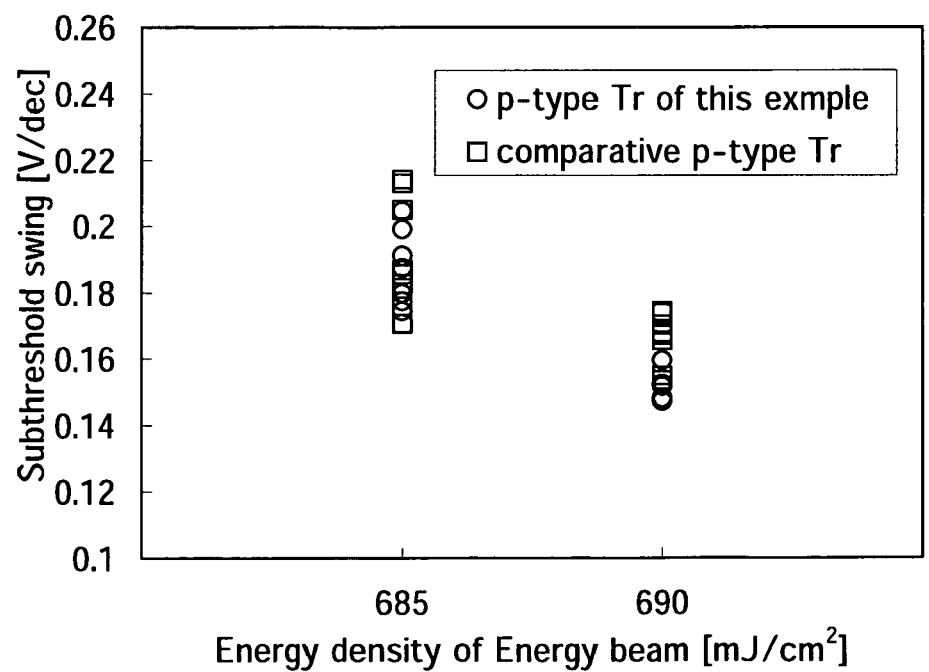

FIGS. 21A and 21B are graphs showing measurement results of subthreshold swings (the unit is V/decade). In FIGS. 21A and 21B, there is a tendency that the subthreshold swing of the transistors of this example is lower than that of the comparative transistors.

From the measurement results in FIG. 19A to FIG. 21B, the transistors which were formed using the single crystal silicon layer having the oxide film formed in the atmosphere containing HCl have higher electron field-effect mobility and lower subthreshold swing than the transistors formed using the single crystal silicon layer having the silicon oxynitride film. Accordingly, by forming a transistor using a single crystal silicon layer having an oxide film formed in an atmosphere containing HCl, a highly reliable semiconductor device can be manufactured.

Example 3

An ion irradiation method, which is one aspect of the present invention, is considered below.

In the present invention, a single-crystal semiconductor substrate is irradiated with ions that are derived from hydrogen (H) (hereafter referred to as "hydrogen ion species"). More specifically, a hydrogen gas or a gas which contains hydrogen in its composition is used as a source material; a hydrogen plasma is generated; and a single-crystal semiconductor substrate is irradiated with the hydrogen ion species in the hydrogen plasma.

(Ions in Hydrogen Plasma)

In such a hydrogen plasma as described above, hydrogen ion species such as $H^+$, $H_2^+$, and $H_3^+$ are present. Here are listed reaction equations for reaction processes (formation processes, destruction processes) of the hydrogen ion species.

$$e + H \rightarrow e + H^+ + e \quad (1)$$

$$e + H_2 \rightarrow e + H_2^+ + e \quad (2)$$

$$e + H_2 \rightarrow e + (H_2)^* \rightarrow e + H + H \quad (3)$$

$$e + H_2^+ \rightarrow e + (H_2^+)^* \rightarrow e + H^+ + H \quad (4)$$

$$H_2^+ + H_2 \rightarrow H_3^+ + H \quad (5)$$

$$H_2^+ + H_2 \rightarrow H^+ + H + H_2 \quad (6)$$

$$e + H_3^+ \rightarrow e + H^+ + H + H \quad (7)$$

$$e + H_3^+ \rightarrow H_2 + H \quad (8)$$

$$e + H_3^+ \rightarrow H + H + H \quad (9)$$

Figure 22:
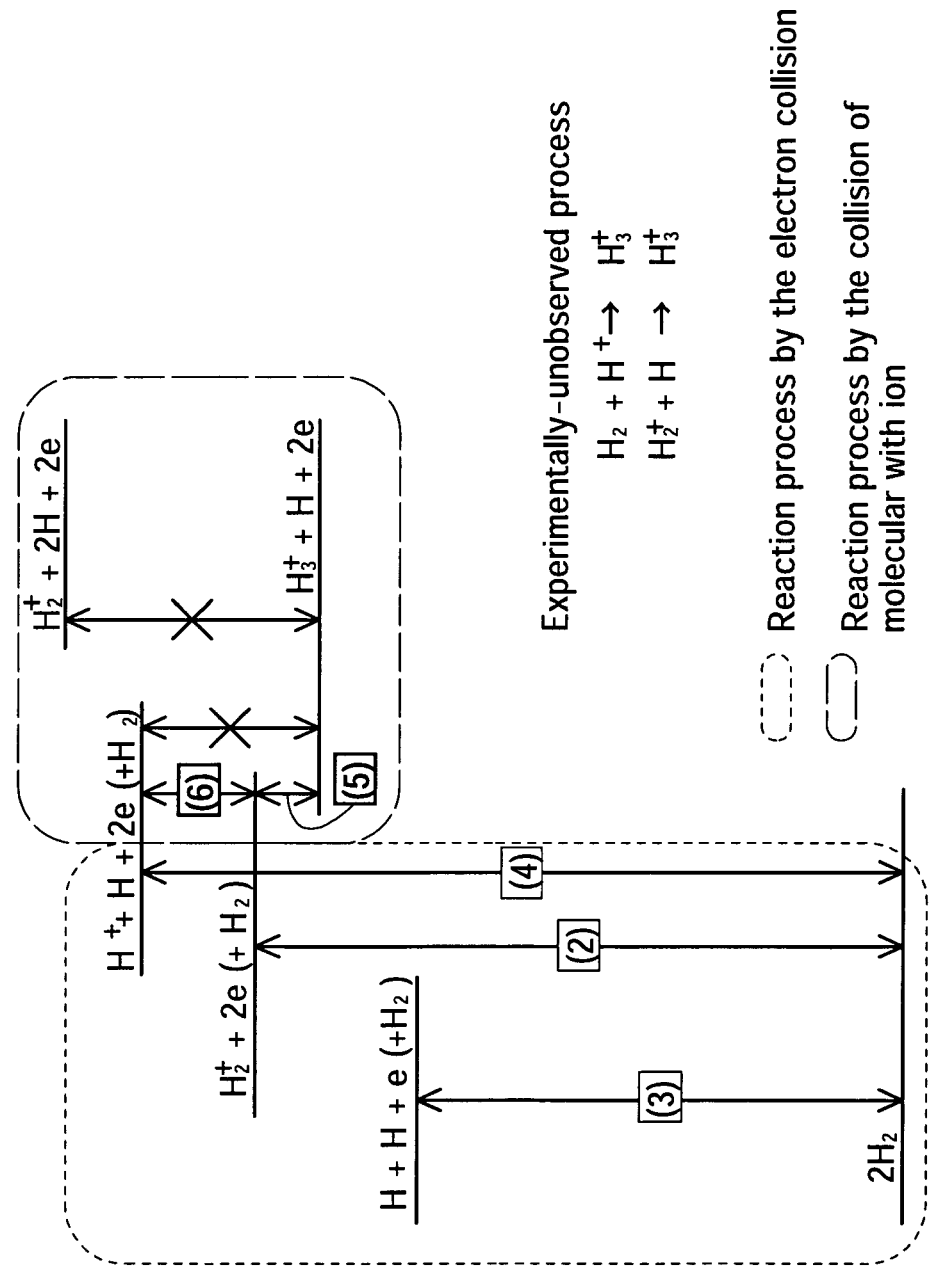
FIG. 22 is an energy diagram of hydrogen ion species.

FIG. 22 is an energy diagram which schematically shows some of the above reactions. Note that the energy diagram shown in FIG. 22 is merely a schematic diagram and does not depict the relationships of energies of the reactions exactly.

($H_3^+$ Formation Process)

As shown above, $H_3^+$ is mainly produced through the reaction process that is represented by the reaction equation (5). On the other hand, as a reaction that competes with the reaction equation (5), there is the reaction process represented by the reaction equation (6). For the amount of $H_3^+$ to increase, at the least, it is necessary that the reaction of the reaction equation (5) occur more often than the reaction of the reaction equation (6) (note that, because there are also other reactions, (7), (8), and (9), through which the amount of $H_3^+$ is decreased, the amount of $H_3^+$ is not necessarily increased even if the reaction of the reaction equation (5) occurs more often than the reaction of the reaction equation (6)). In contrast, when the reaction of the reaction equation (5) occurs less often than the reaction of the reaction equation (6), the proportion of $H_3^+$ in a plasma is decreased.

The amount of increase in the product on the right-hand side (rightmost side) of each reaction equation given above depends on the density of a source material on the left-hand side (leftmost side) of the reaction equation, the rate coefficient of the reaction, and the like. Here, it is experimentally confirmed that, when the kinetic energy of $H_2^+$ is lower than about 11 eV, the reaction of the reaction equation (5) is the main reaction (that is, the rate coefficient of the reaction equation (5) is sufficiently higher than the rate coefficient of the reaction equation (6)) and that, when the kinetic energy of $H_2^+$ is higher than about 11 eV, the reaction of the reaction equation (6) is the main reaction.

A force is exerted on a charged particle by an electric field, and the charged particle gains kinetic energy. The kinetic energy corresponds to the amount of decrease in potential energy due to an electric field. For example, the amount of kinetic energy a given charged particle gains before colliding with another particle is equal to a potential energy lost by transfer of the charged particle. That is, in a situation where a charged particle can travel a long distance in an electric field without colliding with another particle, the kinetic energy (or the average thereof) of the charged particle tends to be higher than that in a situation where the charged particle cannot. Such a tendency toward an increase in kinetic energy of a charged particle can be shown in a situation where the mean free path of a particle is long, that is, in a situation where pressure is low.

Even in a situation where the mean free path is short, the kinetic energy of a charged particle is high if the charged particle can gain a high amount of kinetic energy while traveling through the path. That is, it can be said that, even in the situation where the mean free path is short, the kinetic energy of a charged particle is high if the potential difference is large.

This is applied to $H_2^+$. Assuming that an electric field is present as in a plasma generation chamber, the kinetic energy of $H_2^+$ is high in a situation where the pressure inside the chamber is low and the kinetic energy of $H_2^+$ is low in a situation where the pressure inside the chamber is high. That is, because the reaction of the reaction equation (6) is the main reaction in the situation where the pressure inside the chamber is low, the amount of $H_3^+$ tends to be decreased, and because the reaction of the reaction equation (5) is the main reaction in the situation where the pressure inside the chamber is high, the amount of $H_3^+$ tends to be increased. In addition, in a situation where an electric field in a plasma generation region is high, that is, in a situation where the potential difference between given two points is large, the kinetic energy of $H_2^+$ is high, and in the opposite situation, the kinetic energy of $H_2^+$ is low. That is, because the reaction of the reaction equation (6) is the main reaction in the situation where the electric field is high, the amount of $H_3^+$ tends to be decreased, and because the reaction of the reaction equation (5) is the main reaction in a situation where the electric field is low, the amount of $H_3^+$ tends to be increased.

(Differences Depending on Ion Source)

Figure 23:
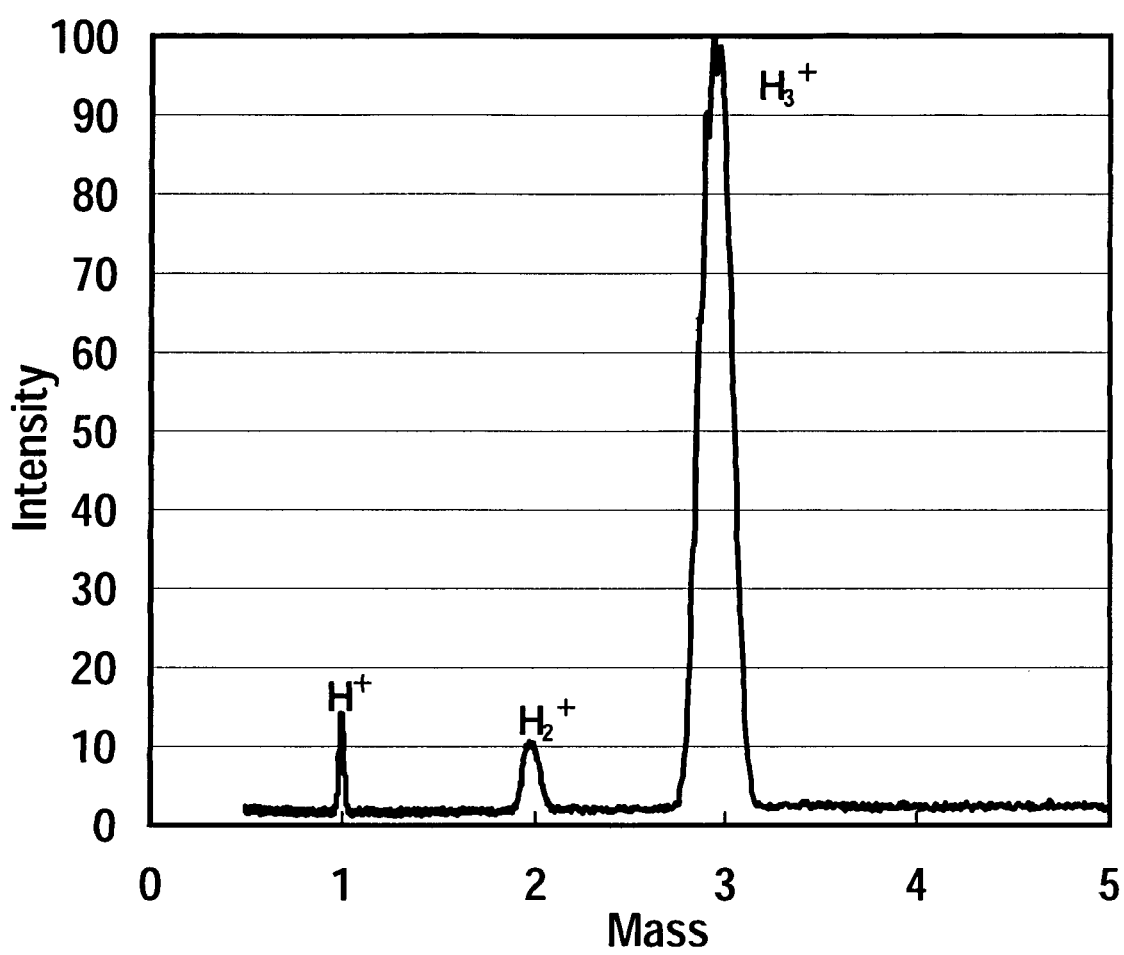
FIG. 23 is a diagram showing the results of ion mass spectrometry.

Here, an example, in which the proportions of ion species (particularly, the proportion of $H_3^+$) are different, is described. FIG. 23 is a graph showing the results of mass spectrometry of ions that are generated from a 100% hydrogen gas (with the pressure of an ion source of $4.7 \times 10^{-2}$ Pa). Note that this mass spectrometry was performed by measurement of ions that were extracted from the ion source. The horizontal axis represents ion mass. In the spectrum, the mass 1 peak, the mass 2 peak, and the mass 3 peak correspond to $H^+$, $H_2^+$, and $H_3^+$, respectively. The vertical axis represents the intensity of the spectrum, which corresponds to the number of ions. In FIG. 23, the number of ions with different masses is expressed as a relative proportion where the number of ions with a mass of 3 is defined as 100. It can be seen from FIG. 23 that the ratio between ion species that are generated from the ion source, i.e., the ratio between $H^+$, $H_2^+$, and $H_3^+$, is about 1:1:8. Note that ions at such a ratio can also be generated by an ion doping apparatus which has a plasma source portion (ion source) that generates a plasma, an extraction electrode that extracts an ion beam from the plasma, and the like.

Figure 24:
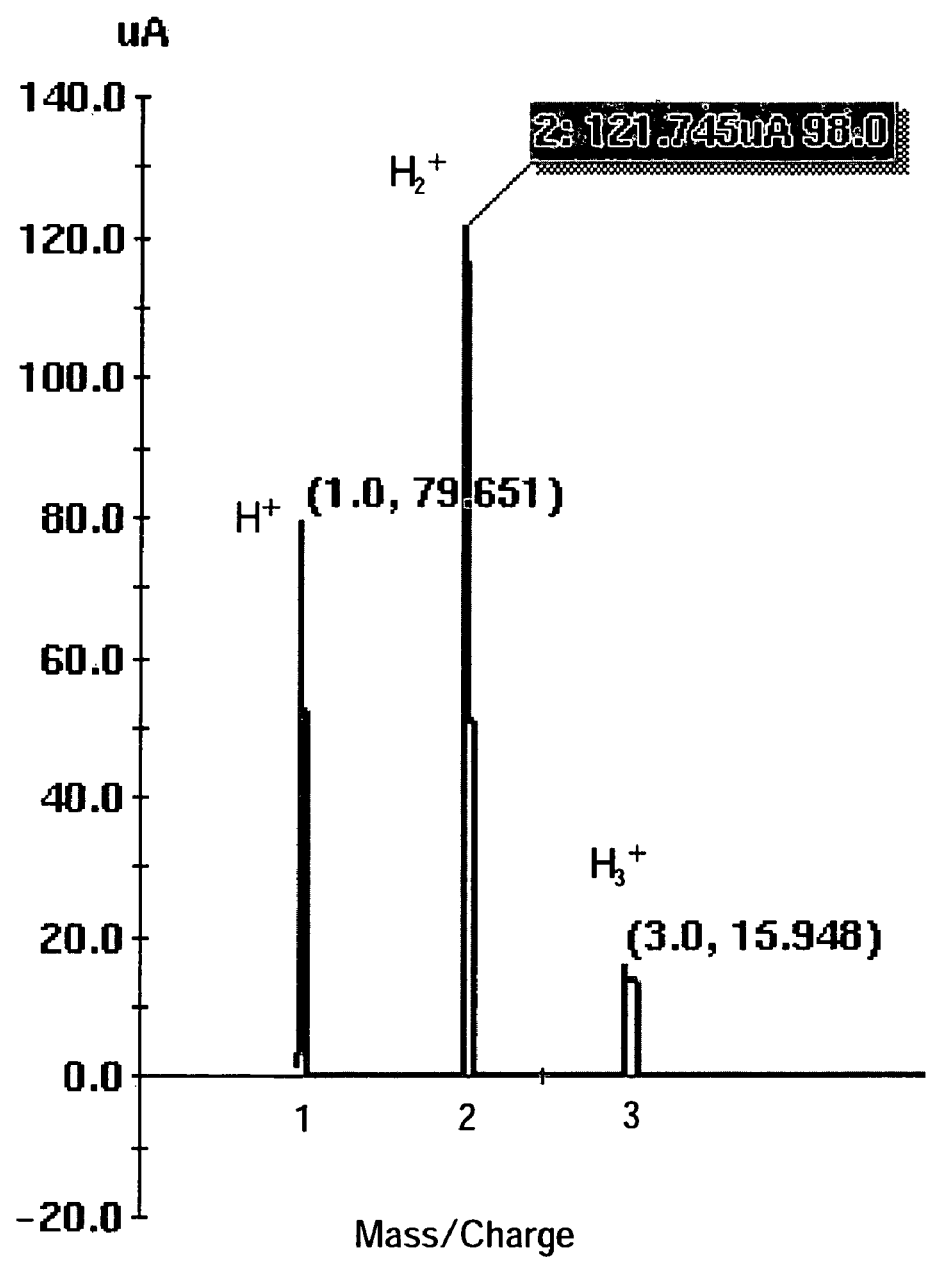
FIG. 24 is a diagram showing the results of ion mass spectrometry.

FIG. 24 is a graph showing the results of mass spectrometry of ions that are generated from $PH_3$ when an ion source different from that for the case of FIG. 23 is used and the pressure of the ion source is about $3 \times 10^{-3}$ Pa. The results of this mass spectrometry focus on the hydrogen ion species. In addition, the mass spectrometry was performed by measurement of ions that were extracted from the ion source. As in FIG. 23, the horizontal axis represents ion mass, and the mass 1 peak, the mass 2 peak, and the mass 3 peak correspond to $H^+$, $H_2^+$, and $H_3^+$, respectively. The vertical axis represents the intensity of a spectrum corresponding to the number of ions. It can be seen from FIG. 24 that the ratio between ion species in a plasma, i.e., the ratio between $H^+$, $H_2^+$, and $H_3^+$, is about 37:56:7. Note that, although FIG. 24 shows the data obtained when the source gas is $PH_3$, the ratio between the hydrogen ion species is about the same when a 100% hydrogen gas is used as a source gas, as well.

In the case of the ion source from which the data shown in FIG. 24 is obtained, $H_3^+$, of $H^+$, $H_2^+$, and $H_3^+$, is generated at a proportion of only about 7%. On the other hand, in the case of the ion source from which the data shown in FIG. 23 is obtained, the proportion of $H_3^+$ can be up to 50% or higher (under the aforementioned conditions, about 80%). This is thought to result from the pressure and electric field inside a chamber, which is clearly shown in the above consideration.

($H_3^+$ Irradiation Mechanism)

When a plasma that contains a plurality of ion species as shown in FIG. 23 is generated and a single-crystal semiconductor substrate is irradiated with the generated ion species without any mass separation being performed, the surface of the single-crystal semiconductor substrate is irradiated with each of $H^+$, $H_2^+$, and $H_3^+$ ions. In order to reproduce the mechanism, from the irradiation with ions to the formation of an ion-introduced region, the following five types of models are considered.

Model 1, where the ion species used for irradiation is $H^+$, which is still $H^+$ (H) after the irradiation.

Model 2, where the ion species used for irradiation is $H_2^+$, which is still $H_2^+$ ($H_2$) after the irradiation.

Model 3, where the ion species used for irradiation is $H_2^+$, which splits into two H atoms ($H^+$ ions) after the irradiation.

Model 4, where the ion species used for irradiation is $H_3^+$, which is still $H_3^+$ ($H_3$) after the irradiation.

Model 5, where the ion species used for irradiation is $H_3^+$, which splits into three H atoms ($H^+$ ions) after the irradiation.

(Comparison of Simulation Results with Measured Values)

Based on the above models, the irradiation of an Si substrate with hydrogen ion species was simulated. As simulation software, SRIM, the Stopping and Range of Ions in Matter (an improved version of TRIM, the Transport of Ions in Matter, which is simulation software for ion introduction processes by a Monte Carlo method) was used. Note that, for the calculation, a calculation based on Model 2 was performed with the $H_2^+$ replaced by $H^+$ that has twice the mass. In addition, a calculation based on Model 4 was performed with the $H_3^+$ replaced by $H^+$ that has three times the mass. Furthermore, a calculation based on Model 3 was performed with the $H_2^+$ replaced by $H^+$ that has half the kinetic energy, and a calculation based on Model 5, with the $H_3^+$ replaced by $H^+$ that has one-third the kinetic energy.

Note that SRIM is software intended for amorphous structures, but SRIM can be applied to cases where irradiation with the hydrogen ion species is performed with high energy at a high dose. This is because the crystal structure of an Si substrate changes into a non-single-crystal structure due to the collision of the hydrogen ion species with Si atoms.

Figure 25:
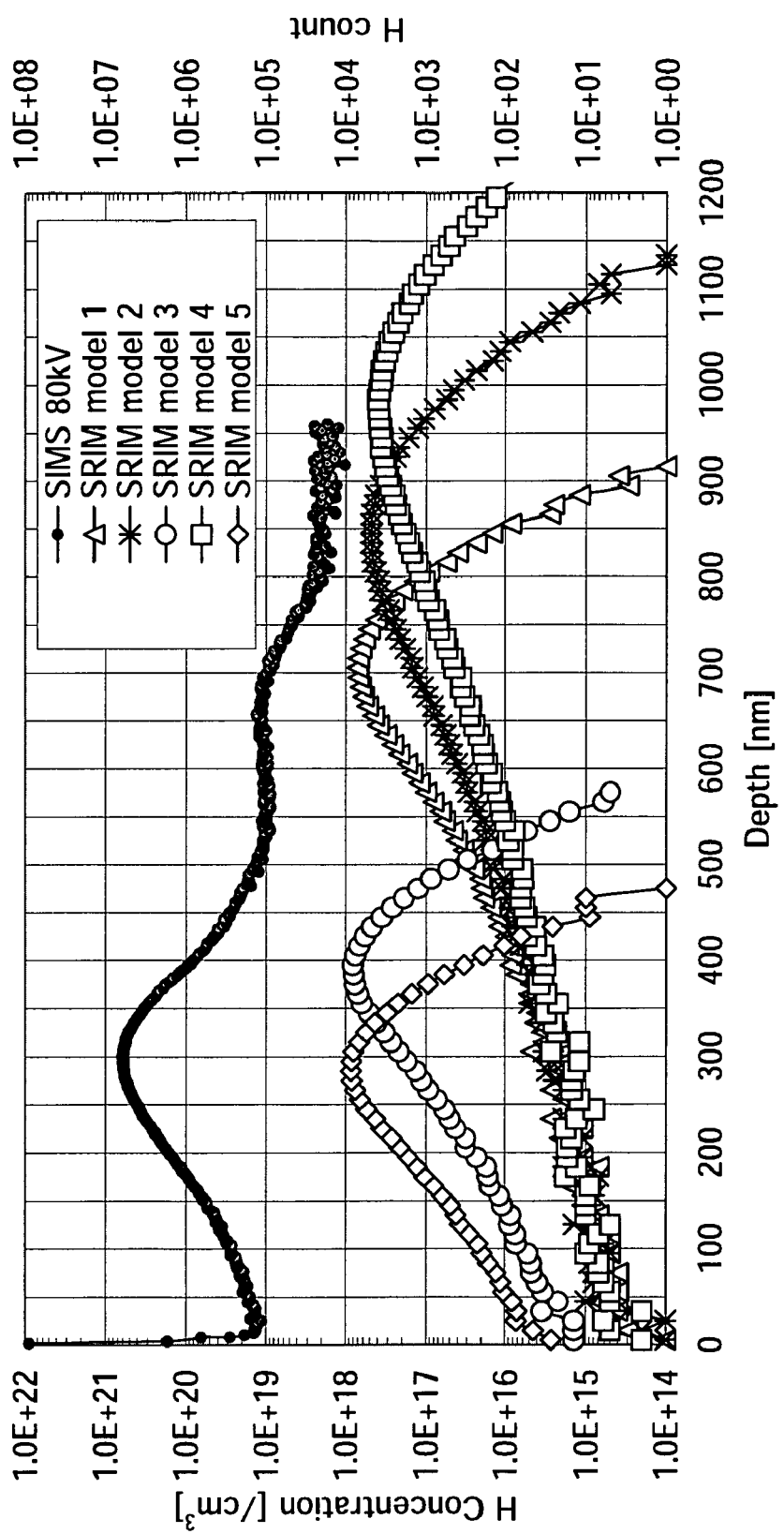
FIG. 25 is a diagram showing the profile (measured values and calculated values) of hydrogen in the depth direction when the accelerating voltage is 80 kV.

FIG. 25 shows the calculation results obtained when irradiation with the hydrogen ion species (irradiation with 100,000 atoms for H) is performed using Models 1 to 5. FIG. 25 also shows the hydrogen concentration (secondary ion mass spectrometry (SIMS) data) in an Si substrate irradiated with the hydrogen ion species of FIG. 23. The results of calculations performed using Models 1 to 5 are expressed on the vertical axis (right axis) as the number of hydrogen atoms, and the SIMS data is expressed on the vertical axis (left axis) as the concentration of hydrogen atoms. The horizontal axis represents depth from the surface of an Si substrate. If the SIMS data, which is measured values, is compared with the calculation results, Models 2 and 4 obviously do not match the peaks of the SIMS data and a peak corresponding to Model 3 cannot be observed in the SIMS data. This shows that the contribution of each of Models 2 to 4 is relatively small. Considering that the kinetic energy of ions is on the order of kiloelectron volts whereas the H—H bond energy is only about several electron volts, it is thought that the contribution of each of Models 2 and 4 is small because $H_2^+$ and $H_3^+$ mostly split into $H^+$ or H by colliding with Si atoms.

Figure 26:
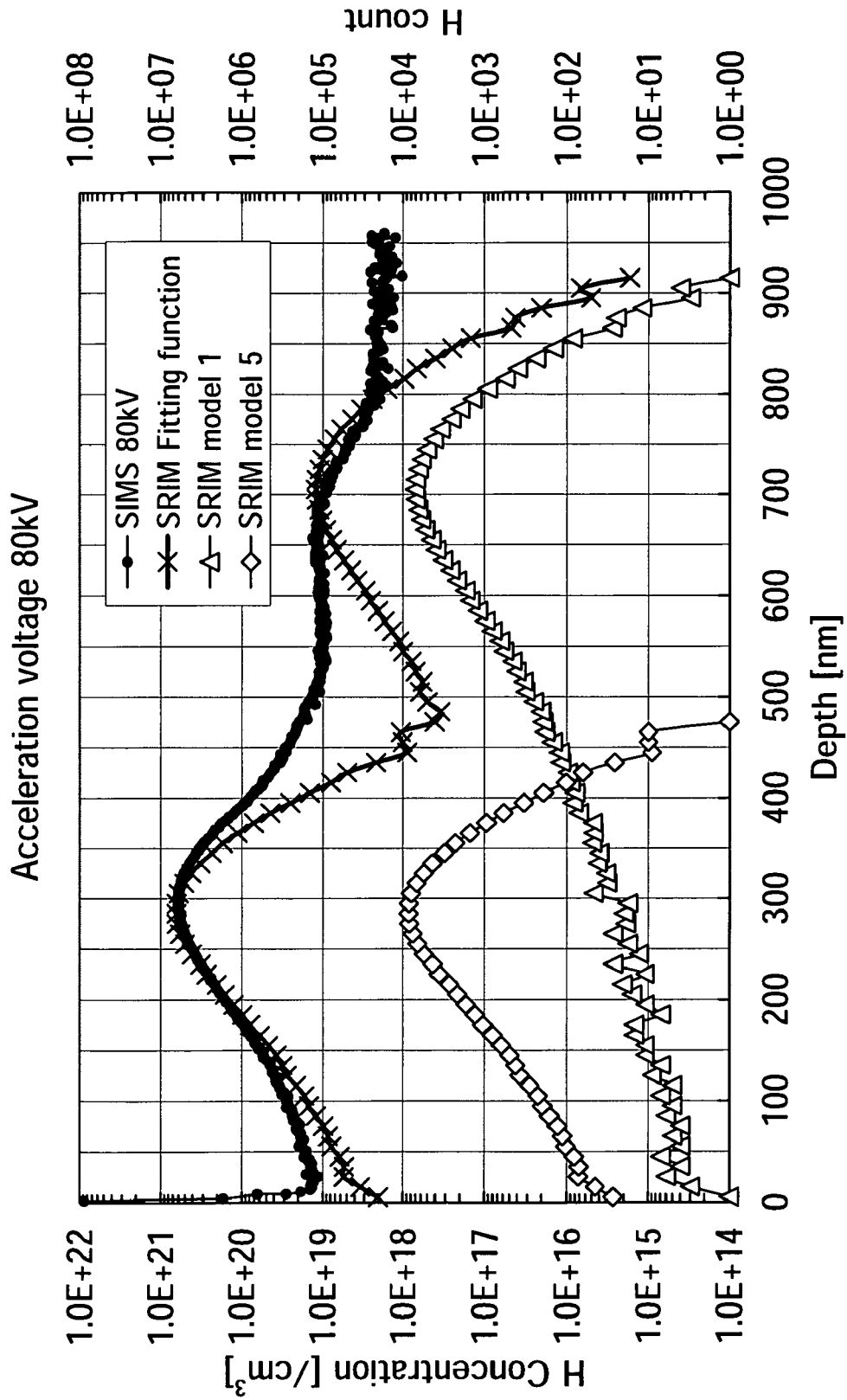
FIG. 26 is a diagram showing the profile (measured values, calculated values, and fitting functions) of hydrogen in the depth direction when the accelerating voltage is 80 kV.
Figure 27:
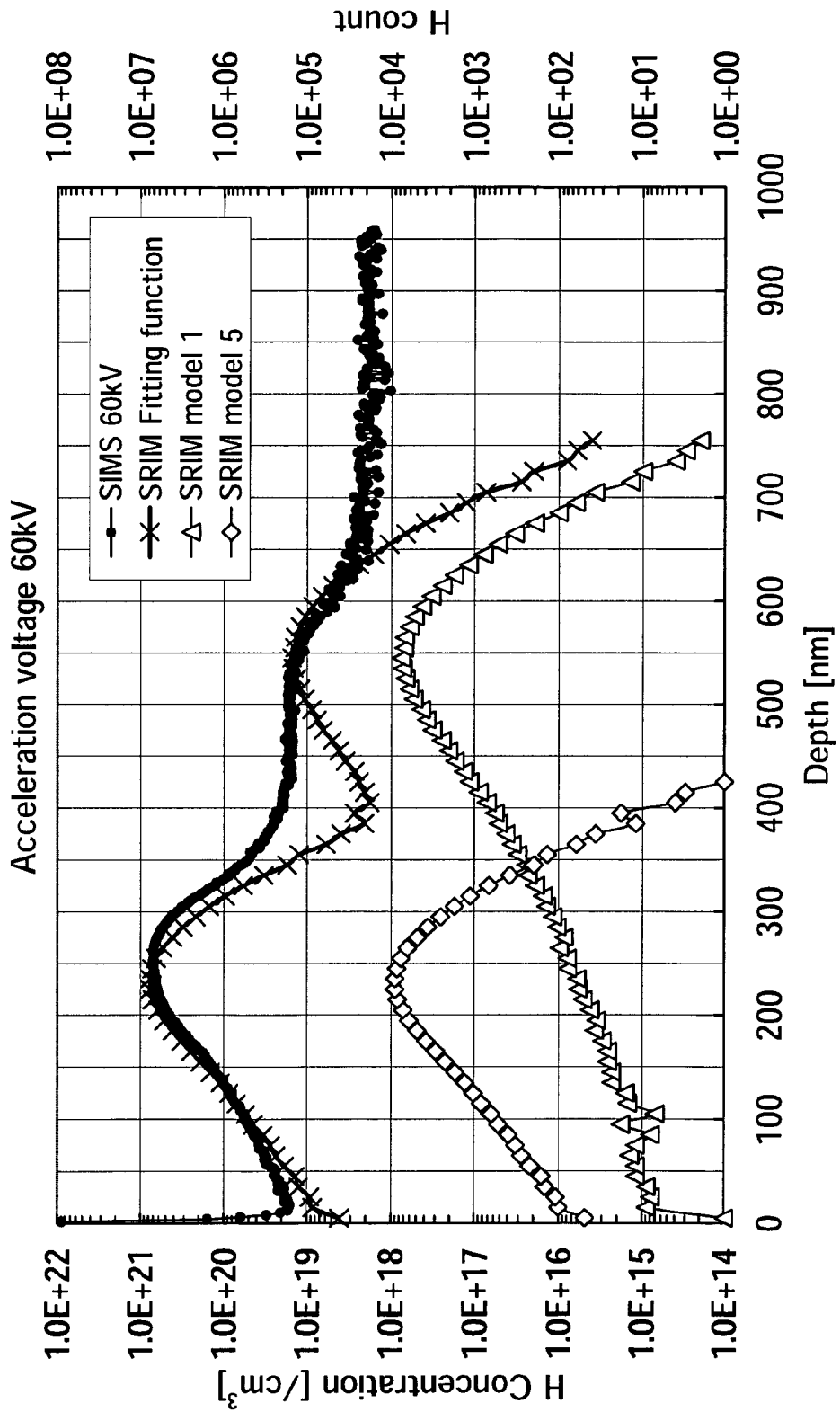
FIG. 27 is a diagram showing the profile (measured values, calculated values, and fitting functions) of hydrogen in the depth direction when the accelerating voltage is 60 kV.
Figure 28:
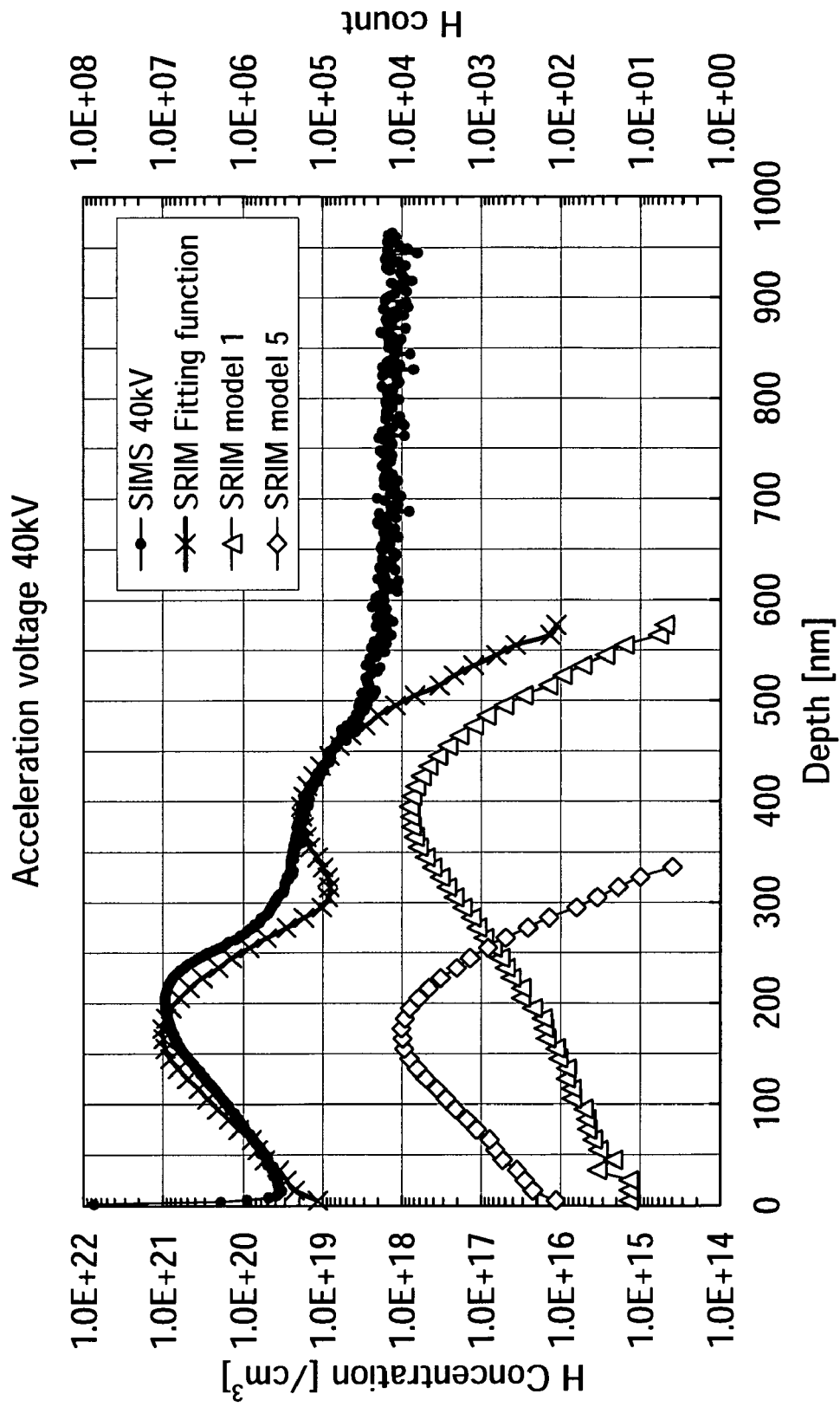
FIG. 28 is a diagram showing the profile (measured values, calculated values, and fitting functions) of hydrogen in the depth direction when the accelerating voltage is 40 kV.

Accordingly, Models 2 to 4 will not be considered hereinafter. FIGS. 26 to 28 each show the calculation results obtained when irradiation with the hydrogen ion species (irradiation with 100,000 atoms for H) is performed using Models 1 and 5. FIGS. 26 to 28 also each show the hydrogen concentration (SIMS data) in an Si substrate irradiated with the hydrogen ion species of FIG. 23, and the simulation results fitted to the SIMS data (hereinafter referred to as a fitting function). Here, FIG. 26 shows the case where the accelerating voltage is 80 kV; FIG. 27, the case where the accelerating voltage is 60 kV; and FIG. 28, the case where the accelerating voltage is 40 kV. Note that the results of calculations performed using Models 1 and 5 are expressed on the vertical axis (right axis) as the number of hydrogen atoms, and the SIMS data and the fitting function are expressed on the vertical axis (left axis) as the concentration of hydrogen atoms. The horizontal axis represents depth from the surface of an Si substrate.

The fitting function is obtained using the calculation formula given below, in consideration of Models 1 and 5. Note that, in the calculation formula, X and Y represent fitting parameters and V represents volume.

(Fitting Function)=$X/V$×(Data of Model 1)+$Y/V$×(Data of Model 5)

In consideration of the ratio between ion species used for actual irradiation ($H^+$:$H_2^+$:$H_3^+$ is about 1:1:8), the contribution of $H_2^+$ (i.e., Model 3) should also be considered; however, Model 3 is excluded from the consideration given here for the following reasons:

Because the amount of hydrogen introduced through the irradiation process represented by Model 3 is extremely lower than that introduced through the irradiation process of Model 5, there is no significant influence even if Model 3 is excluded from the consideration (no peak appears in the SIMS data either).

Model 3, the peak position of which is close to that of Model 5, is likely to be obscured by channeling (movement of atoms due to crystal lattice structure) that occurs in Model 5. That is, it is difficult to estimate fitting parameters for Model 3. This is because this simulation assumes amorphous Si and the influence due to crystallinity is not considered.

FIG. 29 lists the aforementioned fitting parameters. At any of the accelerating voltages, the ratio of the amount of H introduced according to Model 1 to that introduced according to Model 5 is about 1:42 to 1:45 (the amount of H in Model 5, when the amount of H in Model 1 is defined as 1, is about 42 to 45), and the ratio of the number of ions used for irradiation, $H^+$ (Model 1) to that of $H_3^+$ (Model 5) is about 1:14 to 1:15 (the amount of $H_3^+$ in Model 5, when the amount of $H^+$ in Model 1 is defined as 1, is about 14 to 15). Considering that Model 3 is not considered and the calculation assumes amorphous Si, it can be said that values close to that of the ratio between ion species used for actual irradiation ($H^+:H_2^+:H_3^+$ is about 1:1:8) is obtained.

(Effects of Use of $H_3^+$)

A plurality of benefits resulting from $H_3^+$ can be enjoyed by irradiation of a substrate with hydrogen ion species with a higher proportion of $H_3^+$ as shown in FIG. 23. For example, because $H_3^+$ splits into $H^+$, H, or the like to be introduced into a substrate, ion introduction efficiency can be improved compared with the case of irradiation mainly with $H^+$ or $H_2^+$. This leads to an improvement in semiconductor substrate production efficiency. In addition, because the kinetic energy of $H^+$ or H after $H_3^+$ splits similarly tends to be low, $H_3^+$ is suitable for manufacture of thin semiconductor layers.

Note that, in this specification, a method is described in which an ion doping apparatus that is capable of irradiation with the hydrogen ion species as shown in FIG. 23 is used in order to efficiently perform irradiation with $H_3^+$. Ion doping apparatuses are inexpensive and excellent for use in large-area treatment. Therefore, by irradiation with $H_3^+$ by use of such an ion doping apparatus, significant effects such as an improvement in semiconductor characteristics, an increase in area, a reduction in costs, and an improvement in production efficiency can be obtained. On the other hand, if first priority is given to irradiation with $H_3^+$, there is no need to interpret the present invention as being limited to the use of an ion doping apparatus.

This application is based on Japanese Patent Application serial No. 2007-120288 filed with Japan Patent Office on Apr. 27, 2007, the entire contents of which are hereby incorporated by reference.

The invention claimed is:

1. A method for manufacturing a semiconductor device, comprising the steps of:
    heat treating a semiconductor substrate in an oxidizing atmosphere containing a halogen to form an oxide film on the semiconductor substrate at a temperature higher than or equal to a strain point of a support substrate having an insulating surface;
    irradiating the oxide film with an ion to form a separation layer in the semiconductor substrate;
    forming a blocking layer over the oxide film at a temperature equal to or lower than the strain point of the support substrate having the insulating surface;
    forming a bonding layer over the blocking layer;
    superposing the semiconductor substrate and the support substrate having the insulating surface with the oxide film, the blocking layer and the bonding layer interposed therebetween, and
    separating in the separate layer to leave a portion of the semiconductor substrate over the support substrate having the insulating surface.

2. The method for manufacturing a semiconductor device according to claim 1, wherein the semiconductor substrate is a single crystal semiconductor substrate or a polycrystalline semiconductor substrate.

3. The method for manufacturing a semiconductor device according to claim 1, wherein the separation layer has a porous structure.

4. The method for manufacturing a semiconductor device according to claim 1, wherein the oxidation atmosphere containing halogen is an atmosphere in which HCl is added to oxygen.

5. The method for manufacturing a semiconductor device according to claim 1, wherein the oxidation atmosphere containing halogen is an atmosphere in which a kind or plural kinds of gases selected from HF, $NF_3$, Hbr, $Cl_2$, $ClF_3$, $BCl_3$, $F_2$ and $Br_2$ is added to oxygen.

6. The method for manufacturing a semiconductor device according to claim 1, wherein, the blocking layer is a single layer or a stacked layer formed from a group selected from a silicon nitride film, silicon nitride oxide film and a silicon oxynitride film.

7. The method for manufacturing a semiconductor device according to claim 1, wherein the bonding layer comprises silicon oxide.

8. The method for manufacturing a semiconductor device according to claim 1, wherein the bonding layer is formed from TEOS.

9. A method for manufacturing a semiconductor device comprising the steps of:
    heat treating a semiconductor substrate in an oxidizing atmosphere containing a halogen to form an oxide film on the semiconductor substrate at a temperature higher than or equal to a strain point of a support substrate having an insulating surface;
    irradiating the oxide film with an ion to form a separation layer in the semiconductor substrate;
    forming a bonding layer over the support substrate having the insulating surface at a temperature equal to or lower than the strain point of the support substrate having the insulating surface;
    forming a blocking layer over the bonding layer after forming the bonding layer;
    superposing the semiconductor substrate and the support substrate having the insulating surface with the oxide film, the blocking layer and the bonding layer interposed therebetween, and
    separating in the separate layer to leave a portion of the semiconductor substrate over the support substrate having the insulating surface by heat treating.

10. The method for manufacturing a semiconductor device according to claim 9, wherein the semiconductor substrate is a single crystal semiconductor substrate or a polycrystalline semiconductor substrate.

11. The method for manufacturing a semiconductor device according to claim 9, wherein the separation layer has a porous structure.

12. The method for manufacturing a semiconductor device according to claim 9, wherein the oxidation atmosphere containing halogen is an atmosphere in which HCl is added to oxygen.

13. The method for manufacturing a semiconductor device according to claim 9, wherein the oxidation atmosphere containing halogen is an atmosphere in which a kind or plural kinds of gases selected from HF, $NF_3$, Hbr, $Cl_2$, $ClF_3$, $BCl_3$, $F_2$ and $Br_2$ is added to oxygen.

14. The method for manufacturing a semiconductor device according to claim 9, wherein, the blocking layer is a single layer or a stacked layer formed from a group selected from a silicon nitride film, silicon nitride oxide film and a silicon oxynitride film.

15. The method for manufacturing a semiconductor device according to claim 9, wherein the bonding layer comprises silicon oxide.

16. The method for manufacturing a semiconductor device according to claim 9, wherein the bonding is formed from TEOS.

17. A method for manufacturing a semiconductor device comprising the steps of:
    heat treating a semiconductor substrate in an oxidizing atmosphere containing a halogen to form an oxide film on the semiconductor substrate at a temperature higher than or equal to a strain point of a support substrate having an insulating surface;

irradiating the oxide film with an ion to form a separation layer in the semiconductor substrate;

forming a blocking layer over the support substrate having the insulating surface at a temperature equal to or lower than the strain point of the support substrate having the insulating surface;

forming a bonding layer over the blocking layer after forming the blocking layer;

superposing the semiconductor substrate and the support substrate having the insulating surface with the oxide film, the blocking layer and the bonding layer interposed therebetween, and separating in the separate layer to leave a portion of the semiconductor substrate over the support substrate having the insulating surface by heat treating.

18. The method for manufacturing a semiconductor device according to claim 17, wherein the semiconductor substrate is a single crystal semiconductor substrate or a polycrystalline semiconductor substrate.

19. The method for manufacturing a semiconductor device according to claim 17, wherein the separation layer has a porous structure.

20. The method for manufacturing a semiconductor device according to claim 17, wherein the oxidation atmosphere containing halogen is an atmosphere in which HCl is added to oxygen.

21. The method for manufacturing a semiconductor device according to claim 17, wherein the oxidation atmosphere containing halogen is an atmosphere in which a kind or plural kinds of gases selected from HF, $NF_3$, Hbr, $Cl_2$, $ClF_3$, $BCl_3$, $F_2$ and $Br_2$ is added to oxygen.

22. The method for manufacturing a semiconductor device according to claim 18, wherein, the blocking layer is a single layer or a stacked layer formed from a group selected from a silicon nitride film, silicon nitride oxide film and a silicon oxynitride film.

23. The method for manufacturing a semiconductor device according to claim 17, wherein the bonding layer comprises silicon oxide.

24. The method for manufacturing a semiconductor device according to claim 17, wherein the bonding layer is formed from TEOS.

25. The method for manufacturing a semiconductor device according to claim 1, wherein the support substrate is a glass substrate.

26. The method for manufacturing a semiconductor device according to claim 9, wherein the support substrate is a glass substrate.

27. The method for manufacturing a semiconductor device according to claim 17, wherein the support substrate is a glass substrate.

28. The method for manufacturing a semiconductor device according to claim 1, wherein the semiconductor device is one selected from the group consisting of a microprocessor, an RFCPU, a cellular phone, a digital player and an electronic book.

29. The method for manufacturing a semiconductor device according to claim 9, wherein the semiconductor device is one selected from the group consisting of a microprocessor, an RFCPU, a cellular phone, a digital player and an electronic book.

30. The method for manufacturing a semiconductor device according to claim 17, wherein the semiconductor device is one selected from the group consisting of a microprocessor, an RFCPU, a cellular phone, a digital player and an electronic book.

* * * * *